(12) United States Patent
Cho et al.

(10) Patent No.: US 12,389,741 B2
(45) Date of Patent: Aug. 12, 2025

(54) LIGHT-EMITTING DEVICE AND LIGHT-EMITTING DISPLAY DEVICE INCLUDING THE SAME

(71) Applicant: LG Display Co., Ltd., Seoul (KR)

(72) Inventors: Myeong Seon Cho, Paju-si (KR); Sae Mi Park, Paju-si (KR); Wook Song, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 449 days.

(21) Appl. No.: 18/071,289

(22) Filed: Nov. 29, 2022

(65) Prior Publication Data
US 2023/0217668 A1    Jul. 6, 2023

(30) Foreign Application Priority Data
Dec. 31, 2021 (KR) .................... 10-2021-0194795

(51) Int. Cl.
*H10K 50/12* (2023.01)
*H10K 50/13* (2023.01)
*H10K 50/16* (2023.01)
*H10K 59/12* (2023.01)

(52) U.S. Cl.
CPC ............ *H10K 50/12* (2023.02); *H10K 50/13* (2023.02); *H10K 50/16* (2023.02); *H10K 59/12* (2023.02)

(58) Field of Classification Search
CPC ........ H10K 50/12; H10K 50/13; H10K 50/16; H10K 59/12; H10K 59/32; H10K 50/131
See application file for complete search history.

(56) References Cited

U.S. PATENT DOCUMENTS

| 2014/0183494 A1* | 7/2014 | Kam ................. H10K 59/351 257/40 |
| 2015/0090984 A1* | 4/2015 | Kang ................. H10K 50/131 438/34 |

FOREIGN PATENT DOCUMENTS

| KR | 10-2011-0083541 A |   | 7/2011 |            |
| KR | 20110083541 A | * | 7/2011 | .......... H10K 50/165 |
| KR | 10-1316752 B1 |   | 10/2013 |           |
| KR | 10-2016-0037778 A |   | 4/2016 |           |
| KR | 10-2018-0009522 A |   | 1/2018 |           |
| KR | 10-2018-0058032 A |   | 5/2018 |           |

OTHER PUBLICATIONS

Rothe Carsten et al., Translation for KR 20110083541 A, "Organic Light-Emitting Component" (Year: 2011).*

* cited by examiner

*Primary Examiner* — Andres Munoz
*Assistant Examiner* — Ashley Nicole Blackwell
(74) *Attorney, Agent, or Firm* — Birch, Stewart, Kolasch & Birch, LLP

(57) ABSTRACT

Discussed is a light-emitting device that can include a first electrode and a second electrode facing each other, and disposed on a substrate; a first light emitting stack and a second light emitting stack between the first electrode and the second electrode; and a charge generation stack between the first light emitting stack and the second light emitting stack. The charge generation stack can include a first layer including a first host, a second host, and a metal dopant, and a second layer including the first host, the metal dopant, a third host, and a p-type organic dopant. Amounts of the metal dopant in the first layer and the second layer respectively can increase in going towards an interface between the first layer and the second layer.

20 Claims, 15 Drawing Sheets

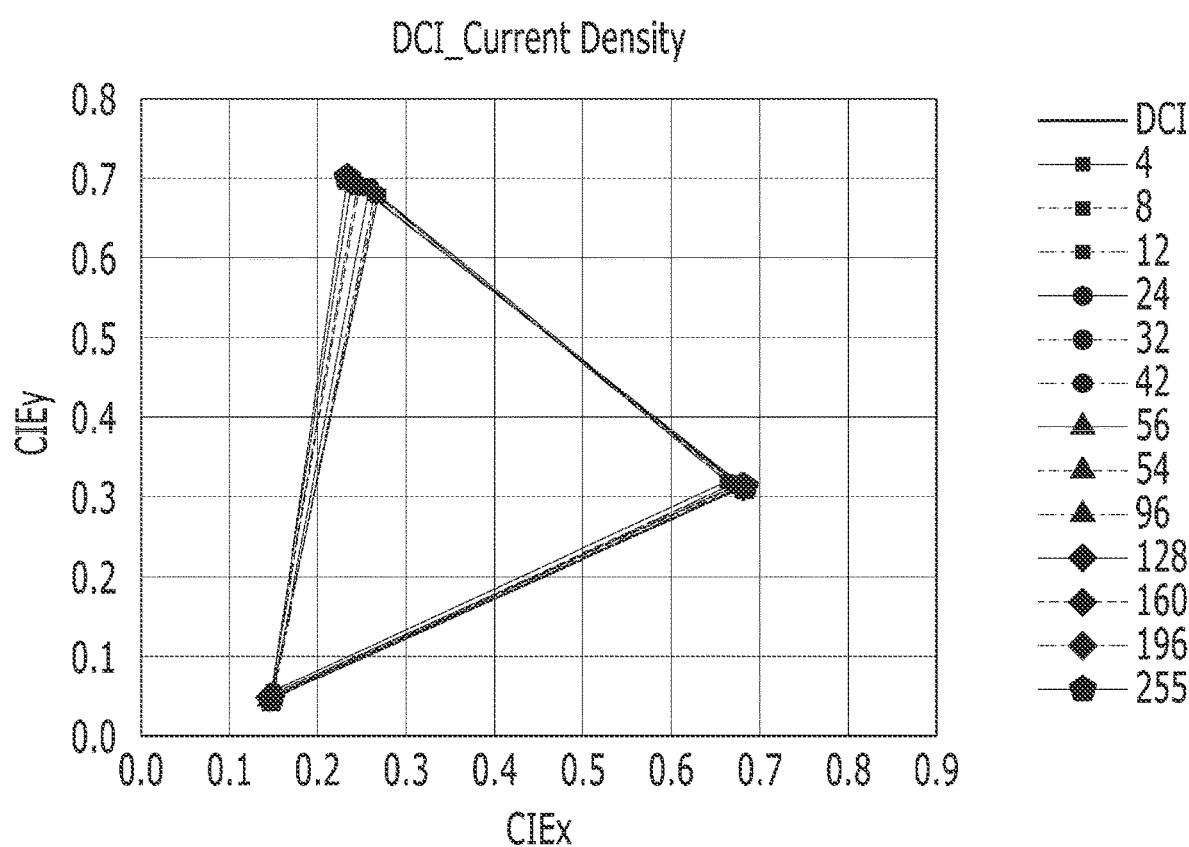

LIGHT-EMITTING DEVICE AND LIGHT-EMITTING DISPLAY DEVICE INCLUDING THE SAME

CROSS-REFERENCE TO RELATED APPLICATIONS

This application claims the benefit of priority to Korean Patent Application No. 10-2021-0194795, filed in the Republic of Korea on Dec. 31, 2021, the entire contents of which are hereby expressly incorporated by reference into the present application.

BACKGROUND OF THE DISCLOSURE

Field of the Invention

Embodiments of present invention relate to a light-emitting device, and more particularly to a light-emitting device having a structure including a plurality of stacks between first and second electrodes that face each other, wherein the light-emitting device is capable of improving pure color efficiency at low grayscale values and stabilizing driving voltage characteristics by reducing a lateral leakage current through change of the configuration of a charge generation unit that separates the plurality of stacks from one another, and a light-emitting display device including the same.

Discussion of the Related Art

In the current information age, displays for displaying information have been rapidly developed. In response thereto, a variety of displays having improved characteristics such as thinness, low weight, and low power consumption have been developed and are rapidly replacing existing cathode ray tubes (CRTs).

Among them, a light-emitting display device that does not require a separate light source and has a light-emitting device in a display panel has come into use to make the display compact and realize clearer color.

Meanwhile, the light-emitting display device can use a charge generation layer for supplying holes and electrons to the adjacent stack and the charge generation layer can include a dopant containing a metal. The charge generation layer has high conductivity in a vertical direction and high conductivity in a horizontal direction, which can cause lateral leakage current.

SUMMARY OF THE DISCLOSURE

Accordingly, embodiments of the present invention are directed to a light-emitting device and a light-emitting display device including the same that substantially obviate one or more problems due to the limitations and disadvantages of the related art.

In view of the above-described problems, the light-emitting device and the light-emitting display device using the same according to one or more embodiments of the present invention include a structure including a plurality of stacks between first and second electrodes facing each other, and are capable of reducing lateral leakage current, improving pure color efficiency at low grayscale values and stabilizing driving voltage properties by changing the configuration of a charge generation unit for separating the stacks from one another.

Additional advantages, objects, and features of the invention will be set forth in part in the description which follows and in part will become apparent to those having ordinary skill in the art upon examination of the following, or can be learned from practice of the invention. The objectives and other advantages of the invention can be realized and attained by the structure particularly pointed out in the written description and claims hereof as well as the appended drawings.

The light-emitting device according to one or more embodiments of the present invention and the light-emitting display device using the same can prevent or reduce lateral leakage current by removing the cause of lateral leakage current in the entire charge generation unit through control of the content of each of the metal dopant and the host included in the charge generation unit.

To achieve these objects and other advantages and in accordance with the purpose of the invention, as embodied and broadly described herein, a light-emitting device includes a first electrode and a second electrode facing each other, a first stack and a second stack disposed between the first electrode and the second electrode, and a charge generation unit disposed between the first stack and the second stack, wherein the charge generation unit includes a first layer including a first host and a second host differing from each other, and a metal dopant, a second layer including the first host, the metal dopant, a third host different from the first and second hosts, and a p-type organic dopant, and a third layer including the third host and the p-type organic dopant, wherein the metal dopant in the first and second layers is present in a maximum amount at the interface between the first and second layers, and the metal dopant in the first and second layers is present along with the first host at any vertical distance from the top surface of the first stack.

In another aspect of the present invention, a light-emitting display device includes a substrate including a plurality of subpixels, a thin film transistor provided in each of the subpixels on the substrate, and the light-emitting device connected to the thin film transistor.

In another aspect of the present invention, a light-emitting device can include a first electrode and a second electrode facing each other, and disposed on a substrate; a first light emitting stack and a second light emitting stack between the first electrode and the second electrode; and a charge generation stack between the first light emitting stack and the second light emitting stack. The charge generation stack can include a first layer including a first host, a second host, and a metal dopant, and a second layer including the first host, the metal dopant, a third host, and a p-type organic dopant. Amounts of the metal dopant in the first layer and the second layer respectively can increase in going towards an interface between the first layer and the second layer.

It is to be understood that both the foregoing general description and the following detailed description of the present invention are by example and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIGS. 5A and 5B are graphs showing the color gamut from low grayscale values to high grayscale values in the first and second experimental examples compared to Digital Cinema Initiative (DCI);

DETAILED DESCRIPTION OF THE EMBODIMENTS

Figure 1:
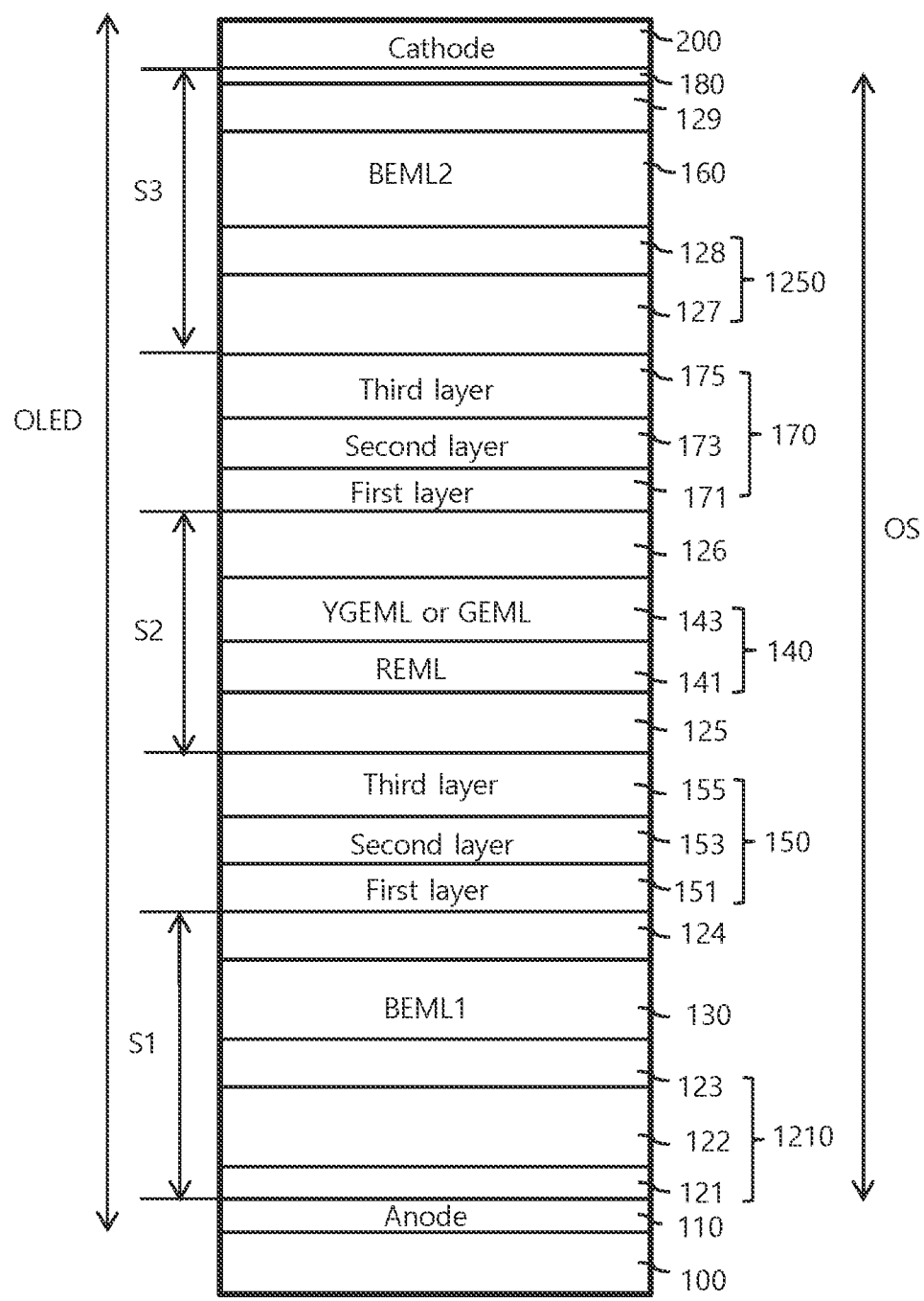
FIG. 1 is a cross-sectional view illustrating a light-emitting device according to an embodiment of the present invention.

Reference will now be made in detail to example aspects of the present disclosure, examples of which are illustrated in the accompanying drawings. Wherever possible, the same reference numbers will be used throughout the drawings to refer to the same or like parts. In the following description of the present disclosure, a detailed description of known functions and configurations incorporated herein will be omitted when it can obscure the subject matter of the present disclosure. In addition, in the following description of the present disclosure, the names of the elements are selected for ease of explanation, and can be different from actual names.

In the drawings for explaining the example aspects of the present disclosure, for example, the illustrated shape, size, ratio, angle, and number are given by way of example, and thus, are not limited to the disclosure of the present disclosure. Throughout the present specification, the same reference numerals designate the same constituent elements. In addition, in the following description of the present disclosure, a detailed description of known functions and configurations incorporated herein will be omitted when it can make the subject matter of the present disclosure rather unclear. The terms "comprises," "includes," and/or "has", used in this specification, do not preclude the presence or addition of other elements unless used along with the term "only". The singular forms are intended to include the plural forms as well, unless the context clearly indicates otherwise.

In the interpretation of constituent elements included in the various aspects of the present disclosure, the constituent elements are interpreted as including an error range even if there is no explicit description thereof.

In the description of the various aspects of the present disclosure, when describing positional relationships, for example, when the positional relationship between two parts is described using "on", "above", "below", "next to", or the like, one or more other parts can be located between the two parts unless the term "directly" or "closely" is used.

In the description of the various aspects of the present disclosure, when describing temporal relationships, for example, when the temporal relationship between two actions is described using "after", "subsequently", "next", "before", or the like, the actions need not occur in succession unless the term "directly" or "just" is used therewith.

In the description of the various aspects of the present disclosure, although terms such as, for example, "first" and "second" can be used to describe various elements, these terms are merely used to distinguish the same or similar elements from each other. Therefore, in the present specification, an element indicated by "first" can be the same as an element indicated by "second" without exceeding the technical scope of the present disclosure, unless otherwise mentioned.

The respective features of the various aspects of the present disclosure can be partially or wholly coupled to and combined with each other, and various technical linkages and modes of operation thereof are possible. These various aspects can be performed independently of each other, or can be performed in association with each other.

In this specification, the term "doped" can refer to a material of any layer having physical properties (e.g., N-type and P-type, or an organic material and an inorganic material) different from the material that occupies the greatest weight percentage of the corresponding layer is added to the material accounting for the greatest weight percentage in an amount corresponding to a weight percentage of 30 vol % or less. In other words, a "doped" layer can refer to a layer in which a host material and a dopant material of any layer are distinguishable from each other in consideration of the weight percentages thereof. In addition, the term "undoped" can refer to all cases excluding the case that corresponds to the term "doped". For example, when any layer is formed of a single material or is formed of a mixture of materials having the same or similar properties, the layer can be considered an "undoped" layer. In another example, when at least one of constituent materials of any layer is of a P-type and all of the other constituent materials of the layer are not of an N-type, the layer can be considered an "undoped" layer. In another example, when at least one of the constituent materials of any layer is an organic material and all of the other constituent materials of the layer are not an inorganic material, the layer can be considered an "undoped" layer. In another example, when all constituent materials of any layer are organic materials, at least one of the constituent materials is of an N-type, at least another constituent material is of a P-type, and the weight percent of the N-type material is 30 vol % or less or the weight percent of the P-type material is 30 vol % or less, the layer can be considered a "doped" layer.

Hereinafter, a light-emitting device according to one or more embodiments of the present invention and a light-emitting display device including the same will be described with reference to the drawings.

Figure 2:
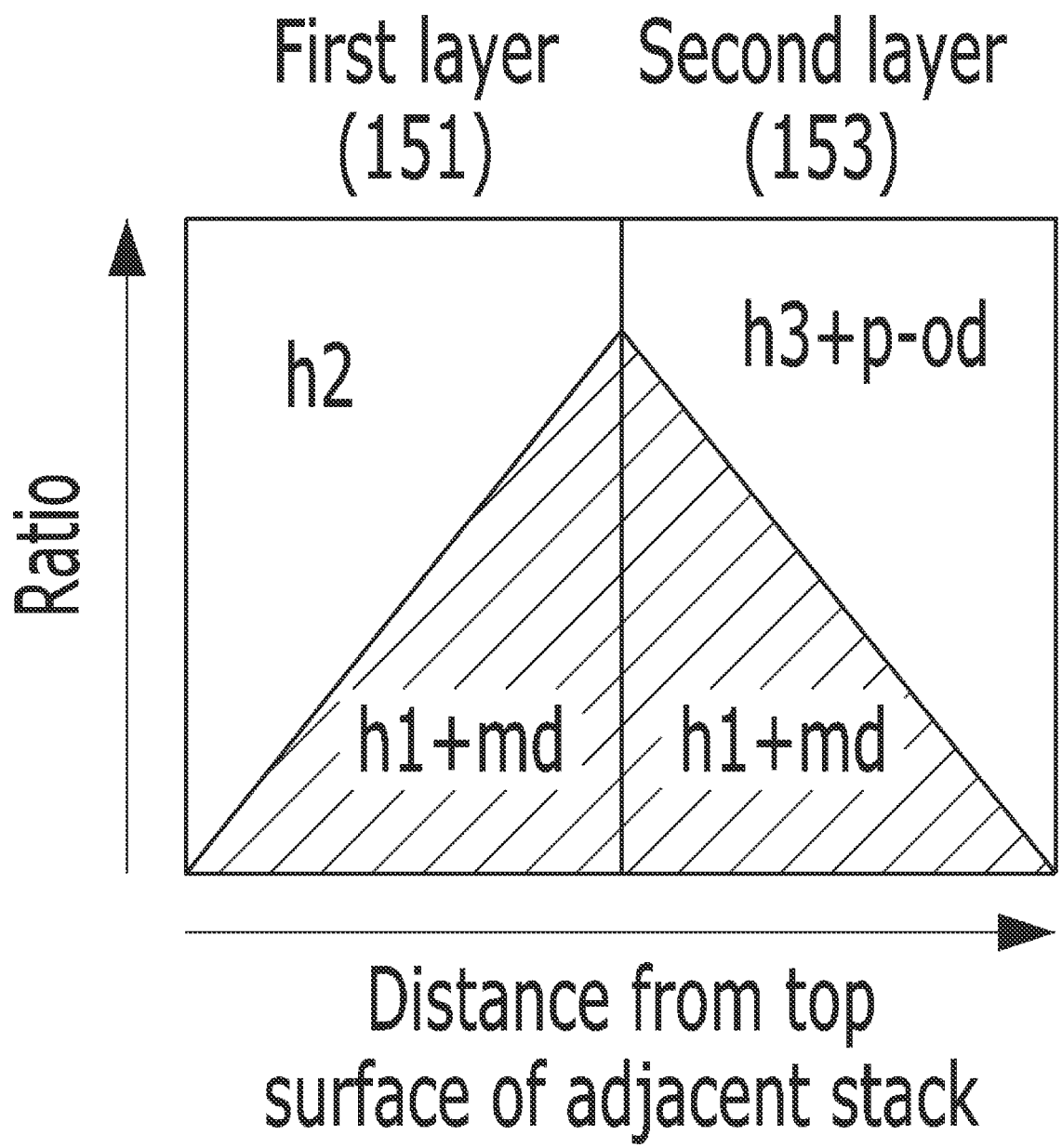
FIG. 2 illustrates component changes of a first host and a metal dopant in a first layer and a second layer of a first charge generation unit of FIG. 1 at a vertical distance from the top surface of a first electron transport layer.

FIG. 1 is a cross-sectional view illustrating a light-emitting device according to an embodiment of the present invention, and FIG. 2 illustrates component changes of a first host and a metal dopant in a first layer and a second layer of a first charge generation unit of FIG. 1 at a vertical distance from the top surface of a first electron transport layer. All components of each light emitting device according to all embodiments of the present disclosure are operatively coupled and configured.

As shown in FIG. 1, the light-emitting device (OLED) according to an embodiment of the present invention includes a first electrode 110 and a second electrode 200 facing each other on a substrate and an internal stack OS disposed between the first electrode and the second electrode. In the illustrated example, the internal stack OS includes first to third stacks S1, S2, and S3. For example, the first stack S1 and the third stack S3 can be blue-light-emitting layers including blue-light-emitting layers BEML1 and BEML2, and the second stack S2 can include a heterogeneous light-emitting unit 140 including a plurality of light-emitting layers (REML/YGEML or GEML) capable of emitting light of a color other than blue. The light-emitting device OLED is capable of emitting white light by combining blue light emitted from the first and third stacks S1 and S3, which emit blue light, with light having a long-wavelength color emitted from the second stack S2 including a complementary-color-light-emitting layer capable of emitting light of a color different from blue. However, the embodiments of the present invention are not limited to the illustrated example, and the light-emitting device OLED can include, as a minimal configuration, the first stack S1, the second stack S2 including a heterogeneous light-emitting layer, and a charge generation unit (CGLU) between the first and second stacks S1 and S2. Alternatively, the light-emitting device OLED can further include an additional stack and a charge generation unit, in addition to the internal stack (OS) of FIG. 1.

When forming a light-emitting display device, a light-emitting device provided in subpixels includes a light-emitting layer and a plurality of functional layers between two electrodes facing each other. In addition, a tandem-type light-emitting display device includes a light-emitting device that includes, between two opposite electrodes, a plurality of stacks and a charge generation layer for separating the stacks from one another, and a light-emitting layer and a plurality of functional layers in each stack in common for all subpixels.

The light-emitting device OLED can be an organic light-emitting device in which all layers include an organic material as a main material, or a light-emitting device based on a material different from an organic light-emitting device including a light-emitting layer or functional layer containing a mixture of an organic material or an inorganic material, or an inorganic material alone.

In particular, the light-emitting device according to one or more embodiments of the present invention prevents lateral leakage current by controlling the contents of hosts present along with the metal dopant in a structure using a metal dopant in at least the first charge generation unit 150, among the charge generation units that separate the stacks S1, S2, and S3 from one another. The configuration and effects of the first charge generation unit 150 will be described in detail later.

In the light-emitting device (OLED) according to an embodiment of the present invention, each layer provided in the internal stack (OS) is a layer including an organic component as a main component, and contains an inorganic material such as a metal in order to improve carrier transport or light-emitting characteristics.

In addition, light emitted from the respective light-emitting layer of the light-emitting stacks S1, S2, and S3 provided in the internal stack OS is combined in a lateral direction of the first electrode 110 and/or the second electrode 200 to express white. When the first electrode 110 is a reflective electrode and the second electrode 200 is a transparent electrode, light is emitted to the second electrode 200, and when the first electrode 110 is a transparent electrode and the second electrode 200 is a reflective electrode, light is emitted to the first electrode 110. In some cases, when both the first and second electrodes 110 and 200 are transparent electrodes, they can transmit light in both directions.

In the example shown in FIG. 1, the light-emitting stacks from the first electrode 110 to the second electrode 200 are arranged such that the first and third stacks S1 and S3 are blue-light-emitting stacks and the second stack S2 is a heterogeneous light-emitting stack, but the order can be changed. In addition, in order to express a white color between the first and second electrodes 110 and 200, only two stacks of a blue-light-emitting stack and a phosphorescent light-emitting stack can be provided, and in some cases, four or more light-emitting stacks can be provided. By varying the number of light-emitting stacks depending on the required color temperature, color coordinate values can be changed depending on the color temperature for expression of white by a white organic light-emitting device to be achieved. When the light-emitting stacks are identical, the color temperature can increase as the number of light-emitting stacks increases.

Meanwhile, when three or more light-emitting stacks are provided between the first and second electrodes 110 and 200, two or more blue-light-emitting stacks can be provided.

For example, the first and third stacks S1 and S3 have emission peaks at a wavelength of 440 nm to 480 nm, and the second stack S2 has an emission peak at a longer wavelength than each of the first and third stacks. For example, the second stack S2 includes a heterogeneous light-emitting unit 140 and thus has a plurality of emission peaks at a wavelength longer than blue, for example, at a wavelength of 500 nm to 650 nm. The heterogeneous light-emitting unit 140 can include, for example, a red-light-emitting layer 141, a yellow-green-light-emitting layer, or a green-light-emitting layer 143. The red-light-emitting layer 141 has an emission peak at a wavelength of 600 nm to 640 nm and can emit red light, and the yellow-green-light-emitting layer has an emission peak at 540 nm to 580 nm and can emit light close to yellow-green. The green-light-emitting layer can have an emission peak at 500 nm to 540 mm and thus can emit green light. In some cases, the heterogeneous light-emitting unit 140 can include two or four or more light-emitting layers instead of the illustrated three layers.

Blue light emitted from the first and third stacks S1 and S3, and green light (and/or yellow light) and red light emitted from the second stack S2 are combined on either side of the first electrode 110 and/or the second electrode 200 to finally emit white light.

Each light-emitting stack S1, S2, or S3 includes a hole transport unit 1210, 125, or 1250, a light-emitting layer 130, 141/143, or 160, and an electron transport layer 124, 126, or 129.

As shown in FIG. 1, the hole transport unit 1210 of the first stack S1 includes a hole injection layer 121, a first hole transport layer 122, and a first electron-blocking layer 123.

The hole injection layer 121 is a layer in direct contact with the first electrode 110 of the internal stack OS, wherein the first electrode 110 includes an inorganic material of a transparent electrode or a reflective electrode component, and lowers interfacial stress and an energy barrier to thereby smoothly inject holes into the internal stack (OS). When the layer in contact with the first electrode 110 is another light-emitting unit, for example, a phosphorescent light-emitting unit, a hole injection layer can be provided in the phosphorescent light-emitting unit. Here, the first electrode 110 functions as an anode.

The first hole transport layer 122 included in the hole transport unit 1210 in the first stack S1 functions to transport holes from the hole injection layer 121 to the first blue-light-emitting layer 130 and to create an appropriate first optical distance of blue from the first electrode 110. This aims at generating a resonance in which reflection and re-reflection are optimally repeated within the distance between the first electrode 110 and the second electrode 200, and can change depending on the position of the reflective electrode among the first electrode 110 and the second electrode 200 and the thickness of the transparent electrode used among the first electrode 110 and the second electrode 200. In addition, the first electron-blocking layer 123 has a function of preventing electrons and/or excitons from passing from the first blue-light-emitting layer 130 to the first hole transport layer 122, and act as a barrier against electrons and excitons while being capable of transporting holes. The thickness of the first hole transport layer 122 and the first electron-blocking layer 123 in the provided first hole transport unit 1210 can be varied, or any one layer among the same can be omitted.

Also, the first stack S1 includes a first blue-light-emitting layer 130 and a first electron transport layer 124 on the first hole transport unit 1210.

The first blue-light-emitting layer 130 as a light-emitting layer provided in the first stack S1 includes a host and a blue dopant that receives energy from excitons generated in the host and emits light. The blue dopant can be a phosphorescent dopant, a fluorescent dopant, or both. The first and second blue-light-emitting layers 130 and 160 of the first and third stacks S1 and S3 used to determine white color coordinates in the following experimental examples include a fluorescent blue dopant. However, this is because among currently developed blue-based dopants, a fluorescent blue dopant has a lifetime and efficiency above a certain level. The phosphorescent blue dopant can replace the fluorescent dopant if it has the same or similar level of lifetime and efficiency. The reason for providing the blue-light-emitting stack separately from the heterogeneous light-emitting stack that emits light with a longer wavelength than blue in the white organic light-emitting device according to one or more embodiments of the present invention is that the visual recognition efficiency of blue is low compared to that of other color, so blue can be realized sufficiently strongly when uniform color expression is required in a display device.

The second stack S2 includes the heterogeneous light-emitting unit 140 including different types of light-emitting layers. The second stack S2 includes a second hole transport layer 125, a red-light-emitting layer 141, a yellow-green-light-emitting layer YGEML or a green-light-emitting layer GEML 143, and a second electron transport layer 126. The second stack S2 includes heterogeneous light-emitting layers.

In the following experimental examples, the heterogeneous light-emitting unit 140 in the second stack S2 is a phosphorescent light-emitting layer, but the embodiments of the present invention are not limited thereto. At least one of the heterogeneous light-emitting units 140 is a fluorescent light-emitting layer or a mixed light-emitting layer including both a phosphorescent dopant and a fluorescent dopant.

The third stack S3 includes a hole transport unit 1250 that includes a third hole transport layer 127 and a second electron-blocking layer 128, which are stacked, a second blue-light-emitting layer 160, and a third electron transport layer 129.

As shown in FIG. 1, the light-emitting device can further include an electron injection layer 180 including an inorganic compound in order to facilitate injection of electrons into the second electrode 200 facing the second blue-light-emitting stack BS2. The electron injection layer 180 can include, for example, an alkali metal or alkaline earth metal compound bonded with fluorine such as LiF or $MgF_2$, some of the material for the second electrode 200, or a transition metal. In some cases, the electron injection layer can be omitted.

In addition, the second electrode 200 can be made of an alloy such as AgMg or another reflective metal or reflective metal alloy when the light-emitting device is a top emission type. In addition, the second electrode 200 can include a reflective metal such as Al when the light-emitting device is a bottom emission type. However, this is only provided as an example and the material for the second electrode 200 can be changed to other metals to facilitate injection of electrons. In some cases, the second electrode 200 can be formed as a stack of a plurality of metal layers, among which only one is a reflective metal and the remaining is a transparent metal, so the stack of the reflective metal and the transparent metal can be formed.

The first charge generation unit 150 provided between at least the first stack S1 and the second stack S2 in the light-emitting device according to one or more embodiments of the present invention includes the first to third layers 151, 153 and 155 having a difference in components. In addition, the first to third layers 151, 153, and 155 function differently from one another.

The first layer 151 includes different first and second hosts h1 and h2 and a metal dopant md, and generates electrons and transfers the generated electrons to the first electron transport layer 124 of the first stack S1. The second layer 153 includes the first host h1, the metal dopant md, a third host h3 different from the first and second hosts h1 and h2, and a p-type organic dopant p-od, and generates both electrons and holes. The third layer 155 includes the third host h3 and the p-type organic dopant p-od, and generates holes and transfers the holes to the second hole transport layer 125 of the heterogeneous light-emitting stack PS.

The first host h1 is a compound capable of combining with the metal dopant md, the second host h2 is an electron transport compound, and the third host h3 is a compound capable of combining with the p-type organic dopant (p-od). When the first host h1 and the metal dopant md are together, such a mix or a combination can be referred to as a host-metal combination. Meanwhile, when the third host h3 and the p-type organic dopant (p-od) are together, such a mix or a combination can be referred to as a host-organic dopant combination. In these instances, reference to a combination does not refer to a bonding of the materials, but such is not necessarily excluded.

In the first layer 151, the first host h1 combines with the metal dopant (md) to generate electrons, and the generated electrons are transferred to the first electron transport layer ETL1 124 of the adjacent first blue-light-emitting stack BS1 through the electron transport property of the second host h2. The second host h2 includes the same organic material as the first electron transport layers ETL1 124 or includes an organic material that has a similar energy bandgap, or has a low energy barrier to transfer electrons from the first layer 151 to the first electron transport layer ETL1 124.

In the second layer 153, the first host h1 combines with the metal dopant md to generate electrons, and the third host h3 combines with the p-type organic dopant p-od to generate holes.

In addition, in the third layer 155, the third host h3 combines with the p-type organic dopant p-od to generate holes.

When current is allowed to flow between the first and second electrodes 110 and 200 by applying a voltage to the first and second electrodes 110 and 200, according to the flow of the current, the holes generated in the second and third layers 153 and 155 are transferred to the second hole transport layer 125 of the second stack S2, and electrons generated in the first layer 151 and the second layer 153 are transferred to the first electron transport layer 124 of the first stack S1, which is the direction opposite the flow of current.

In particular, in the light-emitting device according to one or more embodiments of the present invention, as shown in FIG. 2, the first charge generation unit 150 includes the metal dopant md in the first layer 151 and the second layer 153. However, the content of the metal dopant md is maximized at the interface between the first layer 151 and the second layer 153. In addition, the metal dopant md is present at a constant dopant content with respect to the first host h1 in the first layer 151 and the second layer 153. Also, when the vertical distance from the top surface of the adjacent first stack S1 and the vertical distance from the top surface of the first electron transport layer 124 of the first stack S1 based on FIG. 1 are changed, the content of the metal dopant (md) is maximized at the interface between the first and second layers 151 and 153, as shown in FIG. 2. However, even when the metal dopant md is present at the highest content, the second host h2, having excellent electron transport properties at the interface between the first and second layers 151 and 153, and the entire first layer 151 is further present, in addition to the first host h1 and the metal dopant md, so lateral leakage current in the horizontal direction due to the metal dopant (md) can be prevented. The metal dopant (md) is present in an amount of 5 vol % or less with respect to the first host h1, and the content of metal dopant (md) is maximized at the interface of the first and second layers 151 and 153, in which the content of the metal dopant (md) is much less than the content of the first host h1.

In addition, the second host h2 is present in a content greater than that of the metal dopant md at the interface between the first and second layers 151 and 153, so even in an initial state, in which no voltage is applied, there is physical resistance due to the material of the first layer (151), so the electron movement in the vertical direction in the first layer 151 is greater than the electron movement in the horizontal direction therein.

For example, when the metal dopant md is present in an amount of 2 vol % with respect to the first host h1 in the first layer 151 and the second layer 153, as shown in FIG. 2, the content of the first host h1 increases at a slope of "a" while moving from the interface that is in contact with the first electron transport layer 124 in the first layer 151 to the interface that is in contact with the second layer 153, the first host h1 has a content of a*t*0.98 and the metal dopant md has a content of a*t*0.02 at a vertical distance of t from the top surface of the first electron transport layer 124. The second host h2 must be present at the interface between the first and second layers 151 and 153, and the minimum content of the second host h2 at the interface between the first and second layers 151 and 153 is set to "b".

Accordingly, the second host h2 is a component other than the first host h1 and the metal dopant md in the first layer 151, and the content of the first host h1 decreases with a slope of "a" while moving from the interface that is in contact with the first electron transport layer 124 in the first layer 151 to the interface that is in contact with the second layer 153. For example, the content of the second host h2 is changed with a slope of "−a" in the first layer 151. The second host h2 occupies 100 vol % at the interface between the first electron transport layer 124 and the first layer 151. However, at the interface between the first and second layers 151 and 153, the second host h2 must be present in a minimum content, the content of the first host h1 is changed to "100−a*t" at the vertical distance from the uppermost surface of the first electron transport layer 124, and the minimum of the content of the first host h1 at the interface between the first and second layers 151 and 153 is greater than or equal to b. Here, the minimum b of the first host h1 is greater than the maximum content a*t*0.02 of the metal dopant md at the interface between the first and second layers 151 and 153, in order to prevent the metal dopant md from acting more strongly than the second host h2 at a vertical distance from the top surface of the first electron transport layer 124. For example, the minimum content of the second host h2 at the interface between the first host h1 and the second layer h2 can be not less than 5 vol % and not more than 50 vol %.

In addition, the first host h1 can be a compound including phenanthroline, which is reactive with a metal dopant md, and the second host h2 can be a compound of the anthracene core that has electron transport properties, is reactive with the metal dopant (md), and does not contain phenanthroline.

For example, the first host h1 can be 2-(4-(phenanthren-9-yl)naphthalen-1-yl)-1,10-phenanthroline.

In addition, the first host h1 can be an alkali metal such as lithium (Li), an alkaline earth metal, or a transition metal, which has excellent reactivity with the phenanthroline compound contained in the first and second layers 151 and 153.

The metal dopant (md) is present in an amount of 0.001 vol % to 5 vol % with respect to the first host h1. More preferably, the metal dopant md can be present in an amount of 0.5 vol % to 2 vol % with respect to the first host h1. When the content of the metal dopant exceeds 5 vol %, excess electrons are generated, so the rate at which electrons are supplied from the first blue-light-emitting layer 130 of the first stack S1 is higher than the rate at which the electrons are supplied from the adjacent first hole transport unit 1210, and thus the efficiency of recombination of holes and electrons decreases. In addition, when the content of the metal dopant exceeds 5 vol % of that of the first host h1, the residual metal ions md that do not react with the first host h1 are left in the first layer 151, thus reducing the lifespan of the light-emitting device. On the other hand, when the content of the metal dopant md is less than 0.001 vol %, it is difficult to expect effective electron generation by the metal dopant md.

As shown in FIG. 2, in the light-emitting device of the present invention, in the first layer 151, a first proportion of the first material group including the first host h1 and the metal dopant m1 gradually increases, but a second proportion of the second host h2 gradually decreases from the interface between the first stack S1 and the first layer 151 to the interface between the first and second layers 151 and 153. In the second layer 153, from the interface of the first and second layers 151 and 153 to the interface between the second and third layers 153 and 155, the proportion of the first material group h1+md including the first host h1 and the metal dopant md gradually decreases, and the proportion of the second material group h3+p-od including the third host h3 and the p-type organic dopant p-od gradually increases. Additionally, an amount of the metal dopant md can be a minimum for the first layer 151 at an interface between the first layer 151 and the electron transport layer 124, and at that interface, the minimum amount can include zero. Meanwhile, an amount of the metal dopant md can be a minimum for the second layer 153 at an interface between the second layer 153 and the third layer 155, and that minimum amount can include zero. In one or more embodiments of the present invention, the metal dopant md can be not included in the electron transport layer 124 and/or the third layer 155 so that the electron transport layer 124 and/or the third layer 155 do not include the metal dopant md.

In some cases, at the interface between the first and second layers 151 and 153, the second host h2 left in the content b is deposited at the same reduced rate in the first layer 151 and thus can be incorporated in a region corresponding to part of the thickness of the second layer 153, which is in contact with the first layer 151. In this case, since the second host h2 remains in a trace amount in the second layer 153 compared to the first and third hosts h1 and h3, it does not have a main function.

Also in the second layer 153, the ratio of the metal dopant md to the first host h1 in the first material group h1+md can be constant, and the ratio of the p-type organic dopant p-od to the third host h3 in the second material group h3+p-od can be constant. In the second layer 153, the first host h1 and the metal dopant md decrease at a constant ratio.

Meanwhile, FIG. 1 shows a structure in which the first and second charge generation units 150 and 170 have the same configuration of the first to third layers 151/171, 153/173, and 155/175, but the light-emitting device according to one or more embodiments of the present invention is not limited thereto. Only the first charge generation unit 150 can have a three-layer structure, and a double-layer structure of an n-type charge generation layer and a p-type charge generation layer can be present between the second stack S2 and the third stack S3.

Hereinafter, the significances of the charge generation unit according to one or more embodiments of the light-emitting device of the present invention will be described, as determined through the following experimental examples.

Figure 3:
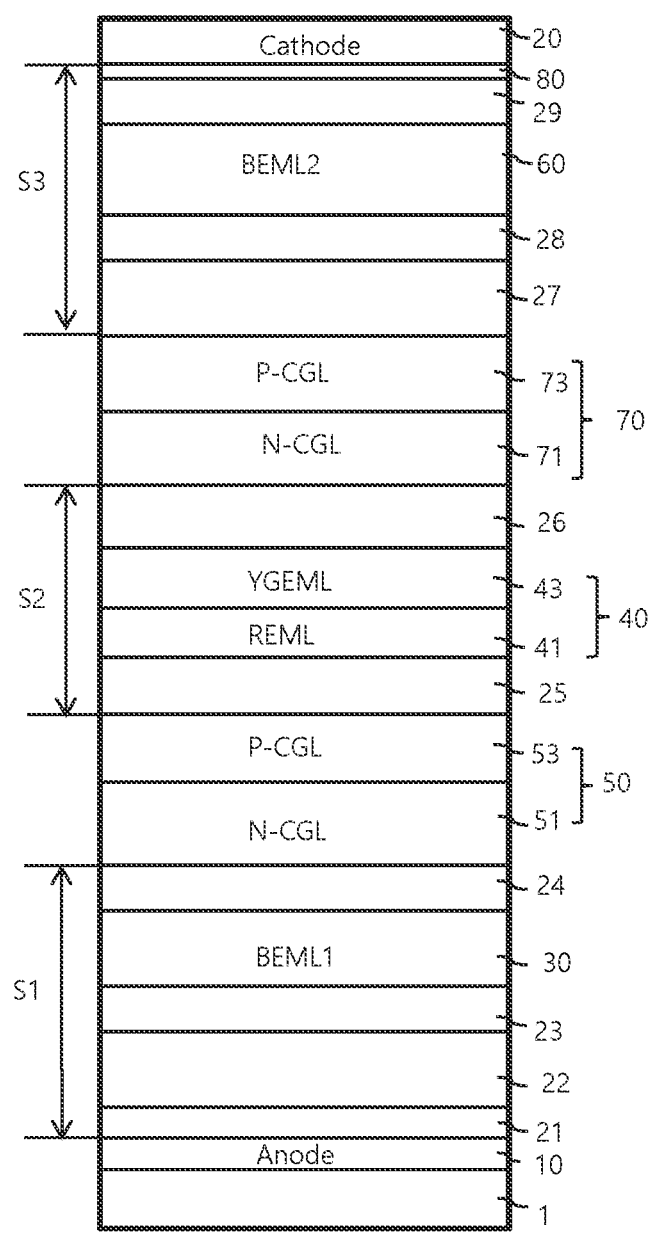
FIG. 3 is a cross-sectional view of a light-emitting device according to a first experimental example.
Figure 4:
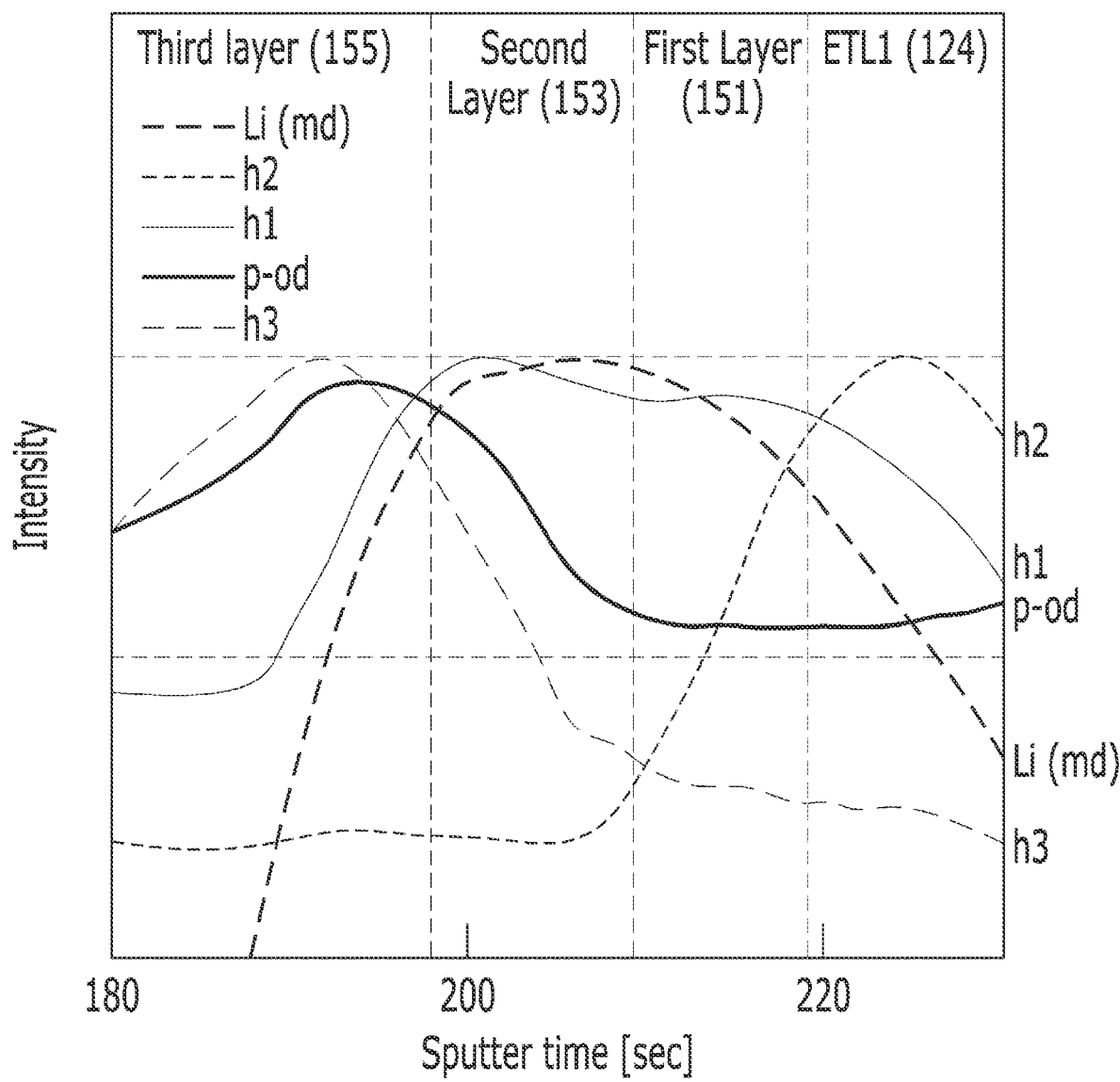
FIG. 4 is a graph showing the change in content ratio for each layer when the first electron generation layer and the first charge generation unit are formed in a second experimental example.

FIG. 3 is a cross-sectional view of a light-emitting device according to a first experimental example. Also, FIG. 4 is a graph showing the change in content ratio for each layer when the first electron generation layer and the first charge generation unit are formed in a second experimental example.

As shown in FIG. 3, the light-emitting device according to the first experimental example Ex1 is similar to the light-emitting device of FIG. 1 between the first electrode 110 and the second electrode 200 having a stacked structure, but compared to the charge generation unit of FIG. 1, the charge generation layers 50 and 70 have a difference in the form in which the n-type charge generation layers 51 and 71 and the p-type charge generation layers 53 and 73 are stacked.

For example, as shown in FIG. 3, the light-emitting device according to the first experimental example Ex1 includes a first electrode 10 disposed on a substrate 1, a first stack S1 including a hole injection layer 21, a first hole transport layer 22, a first electron-blocking layer 23, a first blue-light-emitting layer 30, and a first electron transport layer 24, a second stack S2 disposed on the first stack S1, the second stack S2 including a first charge generation layer 50 including an n-type charge generation layer 51 and a p-type charge generation layer 53, a second stack S2 disposed on the first charge generation layer 50, the second stack S2 including a second hole transport layer 25, a red-light-emitting layer 41, and a yellow-green-light-emitting layer 43, and a second electron transport layer 26, a second charge transport layer 70 including an n-type charge generation layer 71 and a p-type charge generation layer 73, a third stack S3 disposed on the second charge transport layer 70, the third stack S3 including a third hole transport layer 27, a second blue-light-emitting layer 60, a third electron transport layer 29, and an electron injection layer 80, and a second electrode 20 disposed on the third stack S3.

The light-emitting device of the second experimental example Ex2 designed in order to determine the significance of the configuration of the single charge generation unit in a plurality of stacks has the same structure as the structure of the light-emitting device of FIG. 1, except that the charge generation unit 150 of first to third layers 151, 153, and 155 is provided only between the first and second stacks. Also, a double-layer stack including an n-type charge generation layer (n-CGL) and a p-type charge generation layer (p-CGL) is provided between the second stack and the third stacks, as in the first experimental example Ex1.

For example, in the light-emitting device of the second experimental example (Ex2), as shown in FIG. 1, a first electrode 110 is formed to a thickness of 70 nm using a transparent metal of ITO (indium tin oxide), a hole injection layer 121 is formed to a thickness of 5 nm using a $MgF_2$ component, a first hole transport layer 122 is formed to a thickness of 100 nm using a DNTPD component of Formula 1, a first electron-blocking layer 123 is formed to a thickness of 5 nm using a TCTA component of Formula 2, a first blue-light-emitting layer 130 is formed by doping MADN of Formula 3 as the host with DABNA-1 of Formula 4, which is a type of boron-based blue dopant, and a first electron transport layer 124 is formed to a thickness of 22 nm using (Bathophenanthroline) Bphen, containing anthracene as a core, to complete a first stack S1. Then, a charge generation unit including first to third layers 151, 153, and 155 is formed at different component ratios on the first stack S1. For example, the first layer 151 is formed to a thickness of 3 nm (30 Å) using 2-(4-(phenanthren-9-yl)naphthalen-1-yl)-1,10-phenanthroline as a first host h1, lithium as a metal dopant md, and Bphen as a second host h2. As shown in Table 1 and FIG. 4, in the first layer 151, as the thickness (t) changes, the ratio between the first host h1 and the dopant md of the lithium is maintained at 98:2, the proportion of a first material group (h1+Li) including the first host h1 and the lithium dopant in the first layer 151 gradually increases, and the proportion of the second host h2 gradually decreases. The proportion of the second host h1 is 100% at the initial stage of formation of the first layer 151 and is reduced to 10% at the interface with the second layer 153. On the other hand, the proportion of the first material group including the first host h1 and the metal dopant md of lithium gradually increases from 0% to 90%.

As shown in Table 1 and FIG. 4, the ratio between the first host (h1) and the metal dopant (md) in the first material group (h1+Li) is maintained at 98:2, a second material group includes DNTPD as a third host and HAT-CN as a p-type organic dopant, wherein the ratio between the third host and the p-type organic dopant is maintained at 9:1, the proportion of the first material group (h1+Li) gradually decreases as the thickness increases, and the thickness of the second material group (h3+p-od) gradually increases to 3 nm (30 Å).

TABLE 1

| Ex2 | Component | Component proportion (%) depending on distance t |
|---|---|---|
| First layer (t: 0~30 Å) | h1 | 3t * 0.98 |
| | Li | 3t * 0.02 |
| | h2 | 100 − 3t |
| Second layer (t: 0~30 Å) | h1 | 3 * (30 − t) * 0.98 |
| | Li | 3 * (30 − t) * 0.02 |
| | (h3 + p − od) | 3t + 10 |

The third layer 155 includes DNTPD as a third host and HAT-CN as a p-type organic dopant, wherein the ratio between the third host and the p-type organic dopant is maintained at 80:20, and the ratio is maintained at a deposition thickness of 7 nm.

As such, in the second experimental example, the ratio between the first host h1 and the metal dopant in the first material group is maintained at 98:2, and the content of the first material group gradually increases in the first layer 151, but gradually decreases in the second layer 153. The first material group is present at the highest proportion at the interface between the first layer and the second layer and even in the region with the highest proportion, in addition to the first host h1 and the metal dopant md, the second host (h2) is present to prevent the metal dopant from being present in an excessive amount anywhere in the charge generation unit compared to the first experimental example (Ex1). The second host h2 and the third host h3 are further provided in the first layer 151 and the second layer 153 to increase the physical resistance and reduce the horizontal conductivity due to the metal dopant md to thereby prevent or reduce lateral leakage current.

A second stack S2 is formed on the charge generation unit 150 and includes a second hole transport layer 125 formed to a thickness of 5 nm using BABPA of Formula 5, a red-light-emitting layer 141 formed to a thickness of 20 nm by doping BABPA and TPBi of Formula 6 at a ratio of 5:5 as a double host at 5 vol % with Ir(piq)$_2$acac of Formula 7 as a red dopant, a yellow-green-light-emitting layer 143 formed to a thickness of 40 nm by doping CBP of Formula 8 and TPBi at a ratio of 5:5 as a double host at 15 vol % with PO-01 of Formula 9 as a yellow-green dopant, and a second electron transport layer 126 formed to a thickness of 20 nm using TPBi.

Then, an n-type charge generation layer (n-CGL) is formed to a thickness of 20 nm on the second stack S3 by doping Bphen as a host at 3 vol % with lithium (Li), and a p-type charge generation layer (p-CGL) is formed to a thickness of 10 nm by doping DNTPD as a host at 20 vol % with a p-type organic dopant such as HAT-CN to form a charge generation unit including the n-type charge generation layer and the p-type charge generation layer, which are sequentially stacked.

Then, as in the third stack S3 of FIG. 1, a third hole transport layer 127 is formed on the n/p charge generation layer by depositing a DNTPD component to a thickness of 100 nm, an electron-blocking layer 128 is formed to a thickness of 5 nm using TCTA, a second blue-light-emitting layer 160 is formed to a thickness of 20 nm by doping MADN as a host at 5 vol % with DABNA-1 as a dopant, a third electron transport layer 129 is formed to a thickness of 20 nm using BAlq, and an electron injection layer 180 is formed to a thickness of 1.5 nm using LiF.

A second electrode 200 is formed to a thickness of 100 nm on the electron injection layer 180 using aluminum.

[Formula 1]

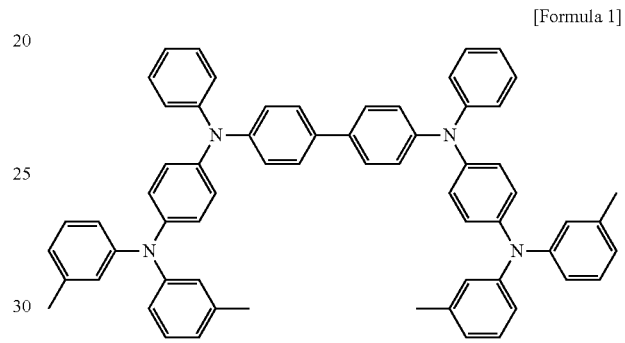

[Formula 2]

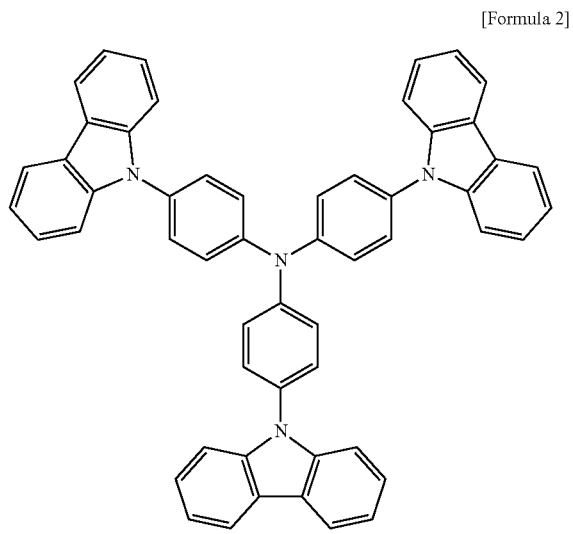

[Formula 3]

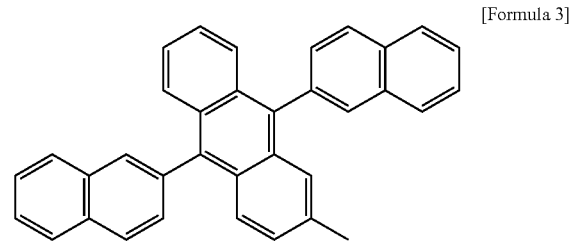

[Formula 4]
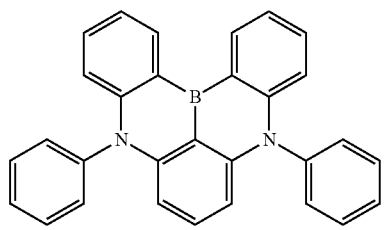

[Formula 5]
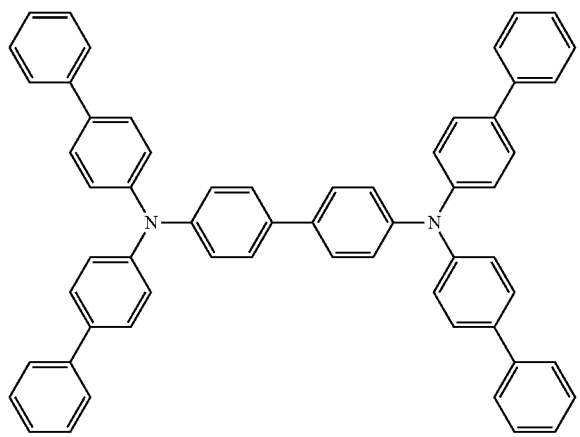

[Formula 6]
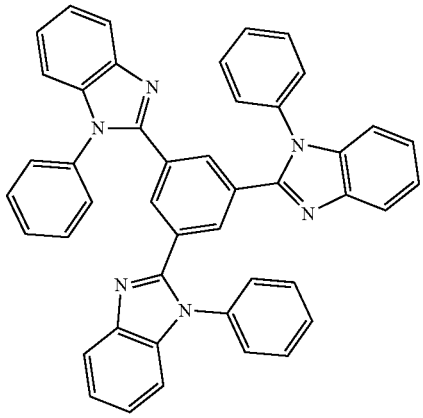

[Formula 7]
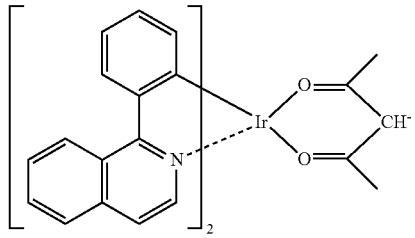

[Formula 8]
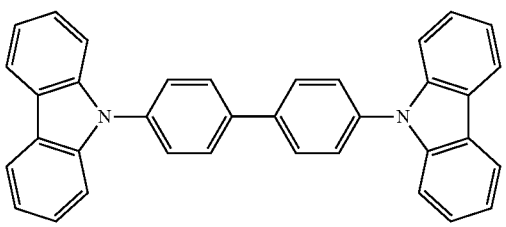

[Formula 9]
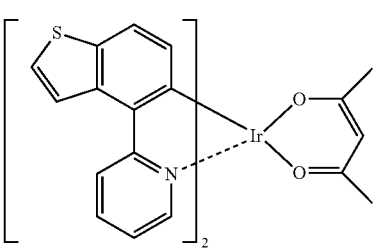

In the first experimental example (Ex1), compared to the second experimental example (Ex2), the first electron transport layer is 10 nm, and the n-type charge generation layer 71 in the first charge generation layer 70 is formed to a thickness of 15 nm by doping Bphen as a host at 2 vol % with lithium. For example, in the first experimental example (Ex1), the host and lithium exist at the same ratio at any vertical position in the n-type charge generation layer 71 from the top surface of the first electron transport layer 24. Then, a p-type charge generation layer 73 is formed to a thickness of 10 nm by doping DNTPD as a host at 20 vol % with a dopant of HAT-CN.

Other layers not described in the light-emitting device of the first experimental example (Ex1) are formed to have the same thickness and components as those of the second experimental example, and the characteristics of the first and second experimental examples Ex1 and Ex2 are compared.

Figure 5A:
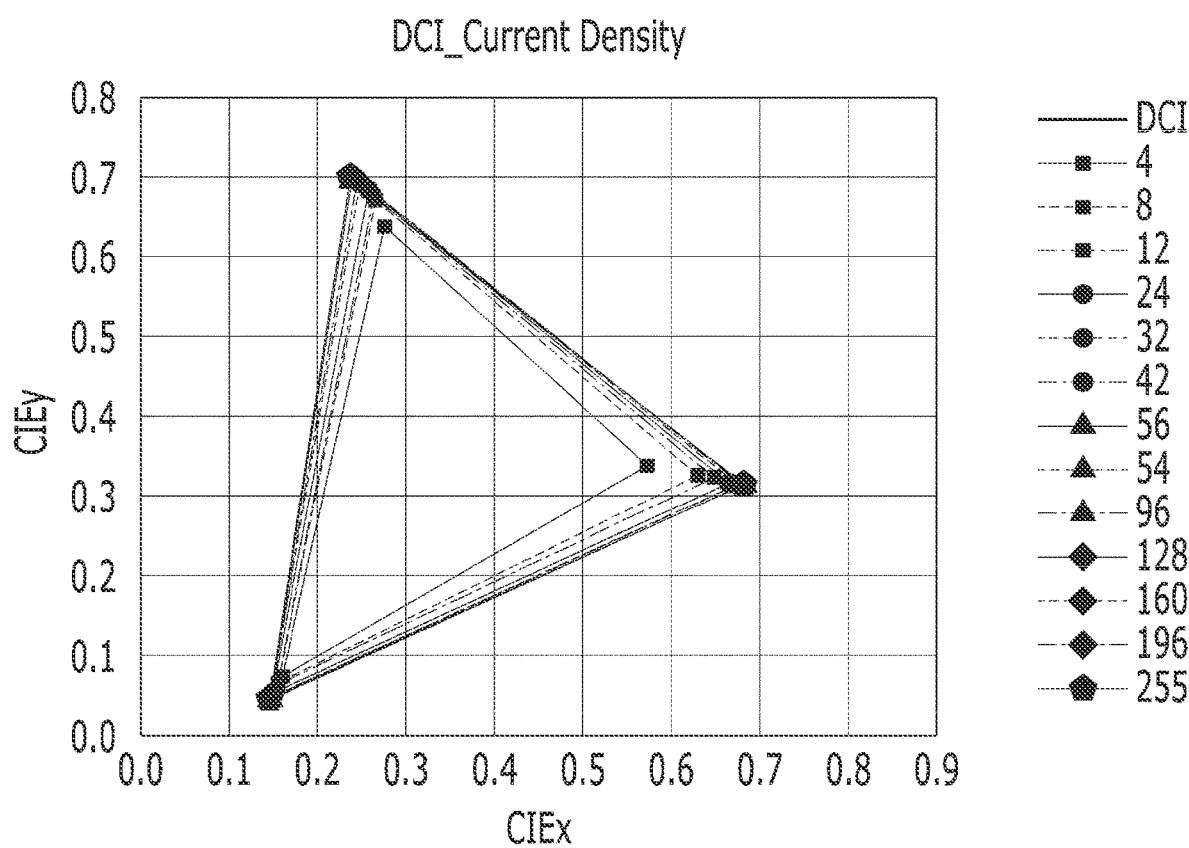
Figure 6:
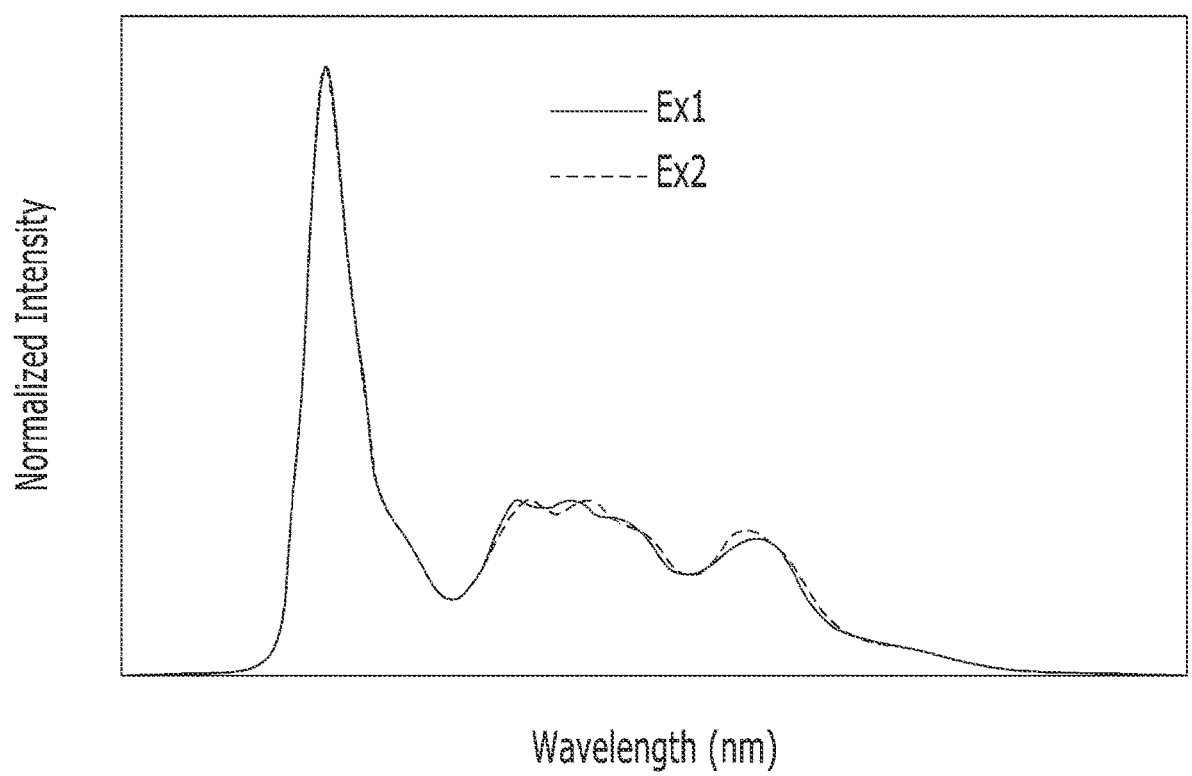
FIG. 6 shows a comparison of nominal light intensity as a function of wavelength between the first experimental example and the second experimental example.

FIGS. 5A and 5B are graphs showing the color gamut from low grayscale values to high grayscale values in first and second experimental examples compared to DCI, and FIG. 6 shows a comparison of nominal light intensity as a function of wavelength between the first experimental example and the second experimental example.

As can be seen from FIG. 5A, the first experimental example Ex1 has a large difference from the DCI color coordinates in red, especially at a low grayscale value of gray 4. It can be considered that the first experimental example (Ex1) is affected by the lateral leakage current when red is expressed at a low grayscale value.

As shown in FIG. 5B, in the second experimental example Ex2, when the charge generation unit having the structure of the first to third layers 151, 153, and 155 according to one or more embodiments of the present invention is applied between the first and second stacks, at both low and high grayscale values, DCI color coordinates are almost uniform for all of red, blue, and green. This solves the effect of the lateral leakage current, which is particularly noticeable at low grayscale values. By controlling the host and the dopant in the charge generation unit having the structure including the first to third layers of the present invention, the conductivity in the horizontal direction is reduced and the conductivity in the vertical direction is increased, so noticeable side leakage current can be prevented.

The leakage current causes white, red, green, and blue subpixels to emit light of a color other than the color intended to be expressed, and thus reduces color purity. In particular, when a leakage current occurs, the visible decrease in color purity in the red subpixel is very severe. Since many light-emitting regions of complementary colors are used to realize white, efficiency of emission of red is decreased. In addition, humans are very insensitive to red and thus are affected by leaked light of other colors due to leakage current upon emission of red light.

By changing the configuration of the charge generation unit, the light-emitting device according to one or more embodiments of the present invention eliminates the cause of the lateral leakage current, thereby preventing the leakage of current from being transferred to adjacent subpixels and improving the color purity degradation in red caused by the lateral leakage current.

FIG. 6 shows that the intensity of red is improved in the second experimental example (Ex2) compared to the first experimental example (Ex1), and distinct yellow-green and green light emission peaks are present between blue and red. This means that the second experimental example (Ex2) is capable of expressing a pure color close to a natural color in yellow green or green.

Hereinafter, a third experimental example (Ex3) having a first material group (first host+metal dopant) without the second or third host at the interface between the first and second layers in the structure including the first to third layers will be described in comparison with the second experimental example (Ex2).

Figure 7:
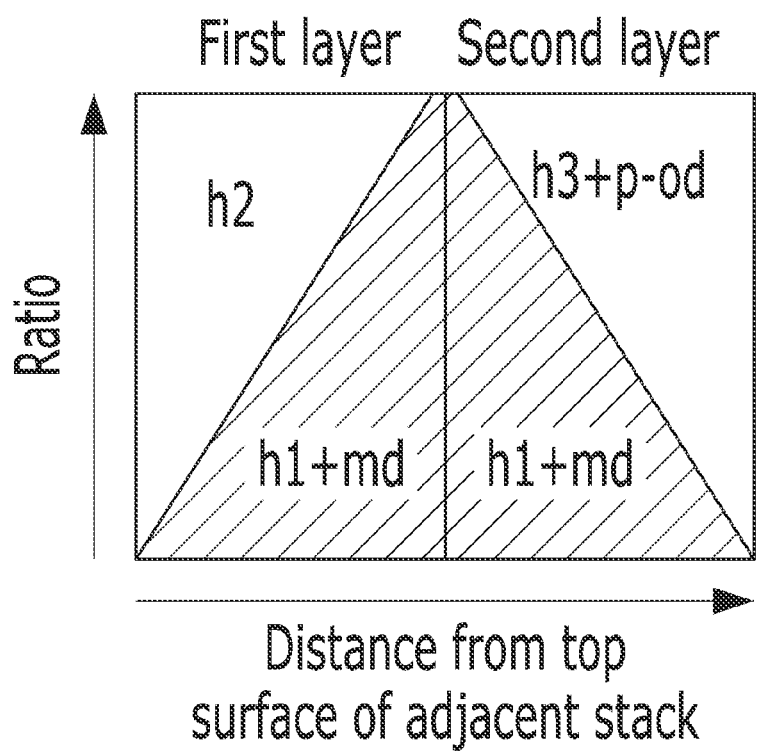
FIG. 7 illustrates component changes of the host and dopant of first and second layers of the first charge generation unit of a light-emitting device according to a third experimental example at a vertical distance from the top surface of the first electron transport layer.
Figure 8:
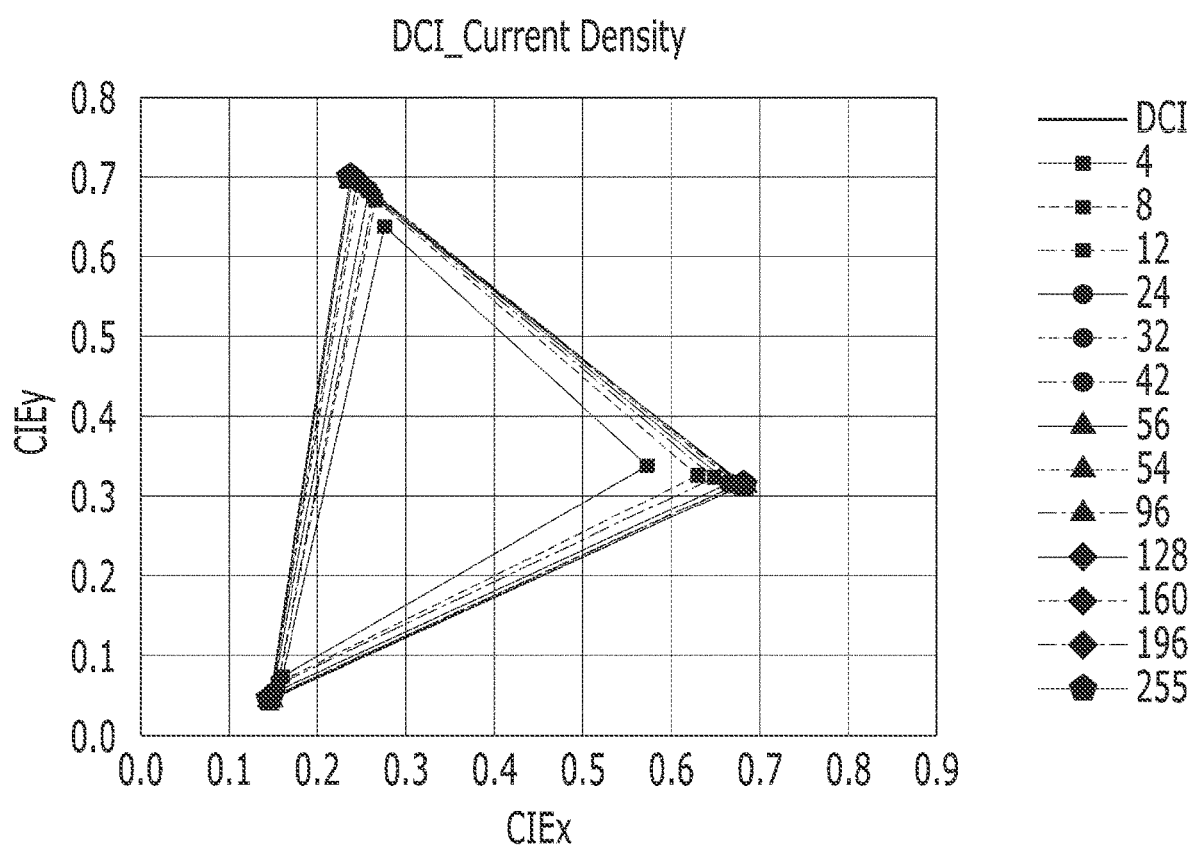
FIG. 8 is a graph showing the color gamut from low grayscale values to high grayscale values for the third experimental example compared to DCI.

FIG. 7 illustrates component changes of the host and dopant of first and second layers of the first charge generation unit of the light-emitting device according to the third experimental example at varying vertical distances from the top surface of the first electron transport layer, and FIG. 8 is a graph showing the color gamut from low to high grayscale values compared to DCI in the third experimental example.

TABLE 2

| Ex3 | Component | Component proportion (%) depending on distance t |
|---|---|---|
| First layer (t: 0~40 Å) | h1 | 2.5t * 0.98 |
| | Li | 2.5t * 0.02 |
| | h2 | 100 − 2.5t |
| Second layer (t: 0~40 Å) | h1 | 2.5 * (40 − t) * 0.98 |
| | Li | 2.5 * (40 − t) * 0.02 |
| | (h3 + p − od) | 2.5t |

In the third experimental example (Ex3), there is a region where only the first material group of the first host h1 and the metal dopant md remains at the interface between the first layer and the second layer.

Here, the thickness of the first electron transport layer 124 is set to 20 nm (200 Å), and the thickness of each of the first layer and the second layer is set to 4 nm (40 Å).

Also, as shown in FIG. 7, in the third experimental example Ex3, in the first layer, the proportion of the first host h1 is varied at a slope of 2.5t*0.98, and the proportion of the metal dopant md is varied at a slope of 2.5t*0.02 at a vertical distance t from the top surface of the first electron transport layer of the adjacent first stack. Also, in the second layer, at a vertical distance t from the interface between the first and second layers, the proportion of the first host h1 is varied at a slope of 2.5*(40−t)*0.98, and the proportion of the metal dopant (md) is varied at a slope of 2.5*(40−t)*0.02.

Here, in the third experimental example (Ex3), the content of the metal dopant is 0% at the contact point with the first electron transport layer, increases toward the interface between the first and second layers in the first layer, has a maximum value of 2% at the interface, gradually decreases in the second layer, and becomes 0% at the interface between the second and third layers.

The remaining layers not described in connection with the third experimental example (Ex3) are the same as in the above-described second experimental example (Ex2).

The third experimental example (Ex3) has the first to third layers, which are distinguished in materials from one another, but has the region having the first material group (h1+Li) in an amount of 100% at the interface between the first and second layers, and has high horizontal conductivity at this interface, and falls outside of DCI coordinates based on the color gamut in red and green, as shown in FIG. 8. This indicates that the purity of red decreases at low grayscale values, similar to the first experimental example (Ex1).

A fourth experimental example (Ex4) in which the proportion of the second host or the third host, rather than the first material group, is higher than 50 vol % at the interface of the first and second layers, will be described in comparison with the third experimental example (Ex3).

Figure 9:
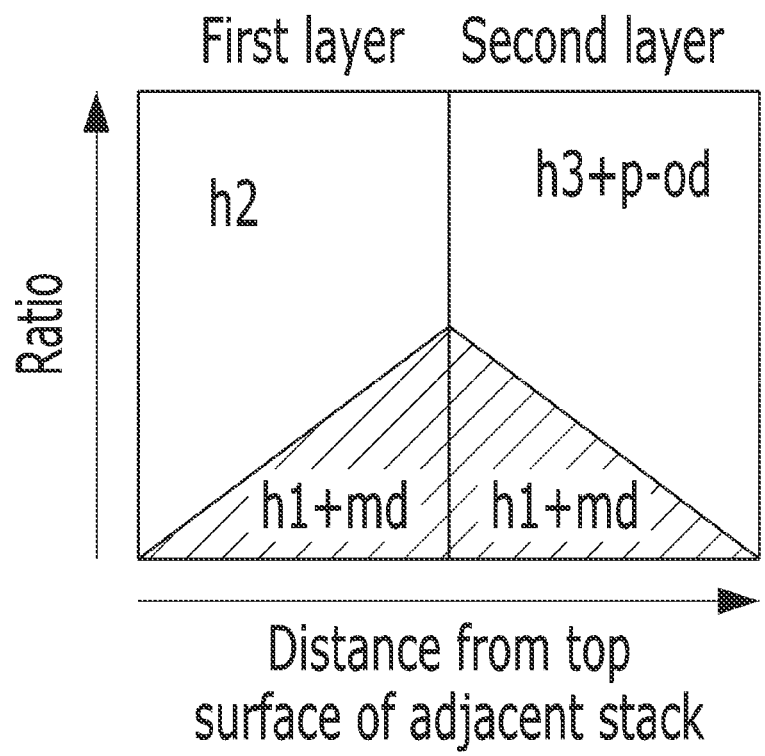
FIG. 9 illustrates component changes of the host and dopant of first and second layers of the first charge generation unit of a light-emitting device according to a fourth experimental example at a vertical distance from the top surface of the first electron transport layer.

FIG. 9 illustrates component changes of the host and dopant of first and second layers of the first charge generation unit of the light-emitting device according to the fourth experimental example at a vertical distance from the top surface of the first electron transport layer.

TABLE 3

| Ex4 | Component | Component proportion (%) depending on distance t |
|---|---|---|
| First layer (t: 0~30 Å) | h1 | 1.5t * 0.98 |
| | Li | 1.5t * 0.02 |
| | h2 | 100 − 1.5t |
| Second layer (t: 0~30 Å) | h1 | 1.5 * (30 − t) * 0.98 |
| | Li | 1.5 * (30 − t) * 0.02 |
| | (h3 + p − od) | 1.5t + 55 |

In the fourth experimental example (Ex4), the thickness of the first electron transport layer 124 is set to 20 nm (200 Å), and the thickness of each of the first layer and the second layer is set to 3 nm (30 Å), like the second experimental example Ex2.

Also, as shown in FIG. 9, in the fourth experimental example Ex4, the proportion of the first host h1 is varied at a slope of 1.5t*0.98, and the proportion of the metal dopant and is varied at a slope of 1.5t*0.02, which is lower than that of the second experimental example, at a vertical distance t from the top surface of the first electron transport layer of the adjacent first stack in the first layer. Also, in the second layer, at a vertical distance t from the interface between the first and second layers, the proportion of the first host h1 is varied at a slope of 1.5*(30−t)*0.98 and the proportion of the metal dopant (md) is varied at a slope of 1.5*(30−t)*0.02.

Here, in the fourth experimental example (Ex4), the first material group has a maximum content of 45% at the interface between the first and second layers in the first layer.

Here, the content of the metal dopant is 0% at the contact point with the first electron transport layer, increases toward the interface between the first and second layers in the first layer, and has a maximum value of 0.9% at the interface. The content of the second host h2 is 55% at the interface between the first and second layers in the first layer. In the second layer, instead of the second host h2, the third host h3 gradually increases from 55%. Substantially, in the fourth experimental example (Ex4), the content of the metal dopant in the first and second layers does not exceed 1% at any vertical distance from the first electron transport layer 124.

In this case, in the fourth experimental example (Ex4), the total content of the metal dopant in the first and second layers is low, so it can be difficult to generate electrons and thus it can be difficult to supply electrons to the first electron transport layer of an adjacent stack. In this case, there is the risk of an increase in the driving voltage.

Figure 10:
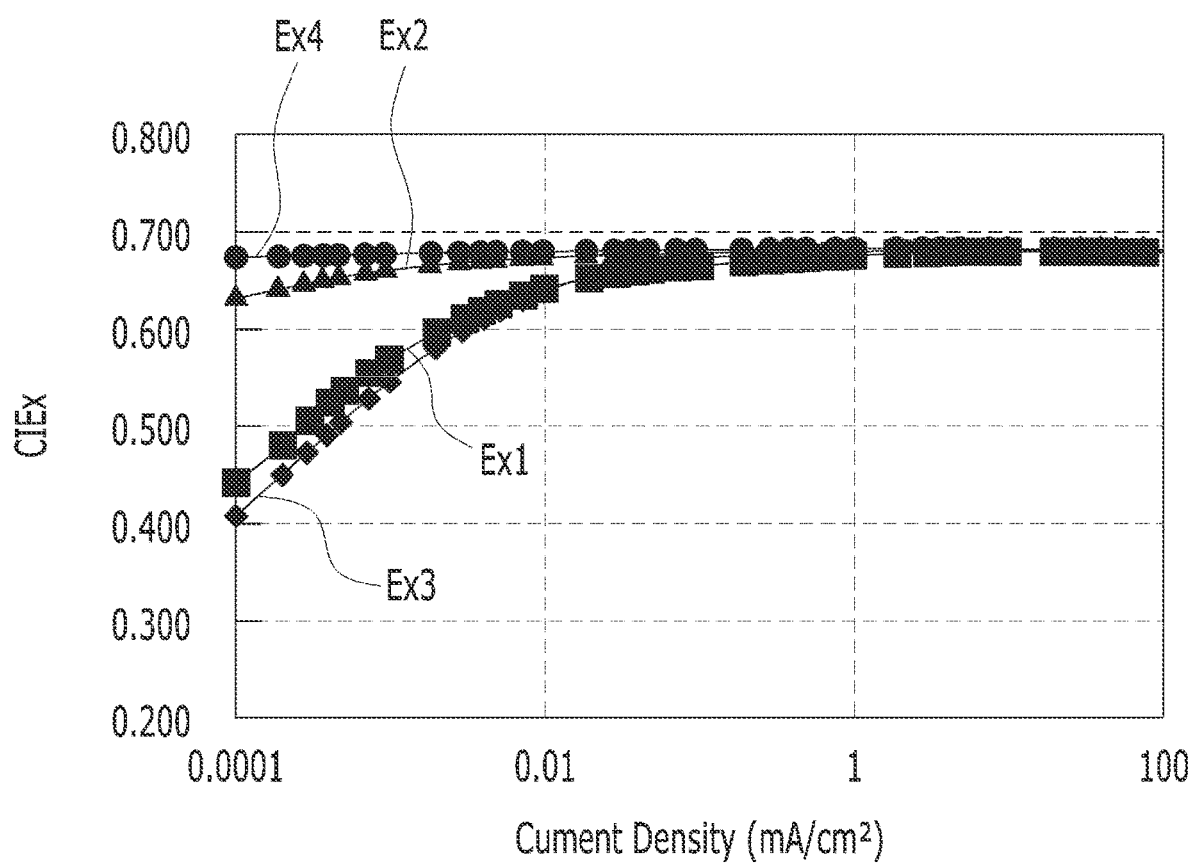
FIG. 10 is a graph showing CIEx coordinates as a function of current density of the first to fourth experimental examples.
Figure 11:
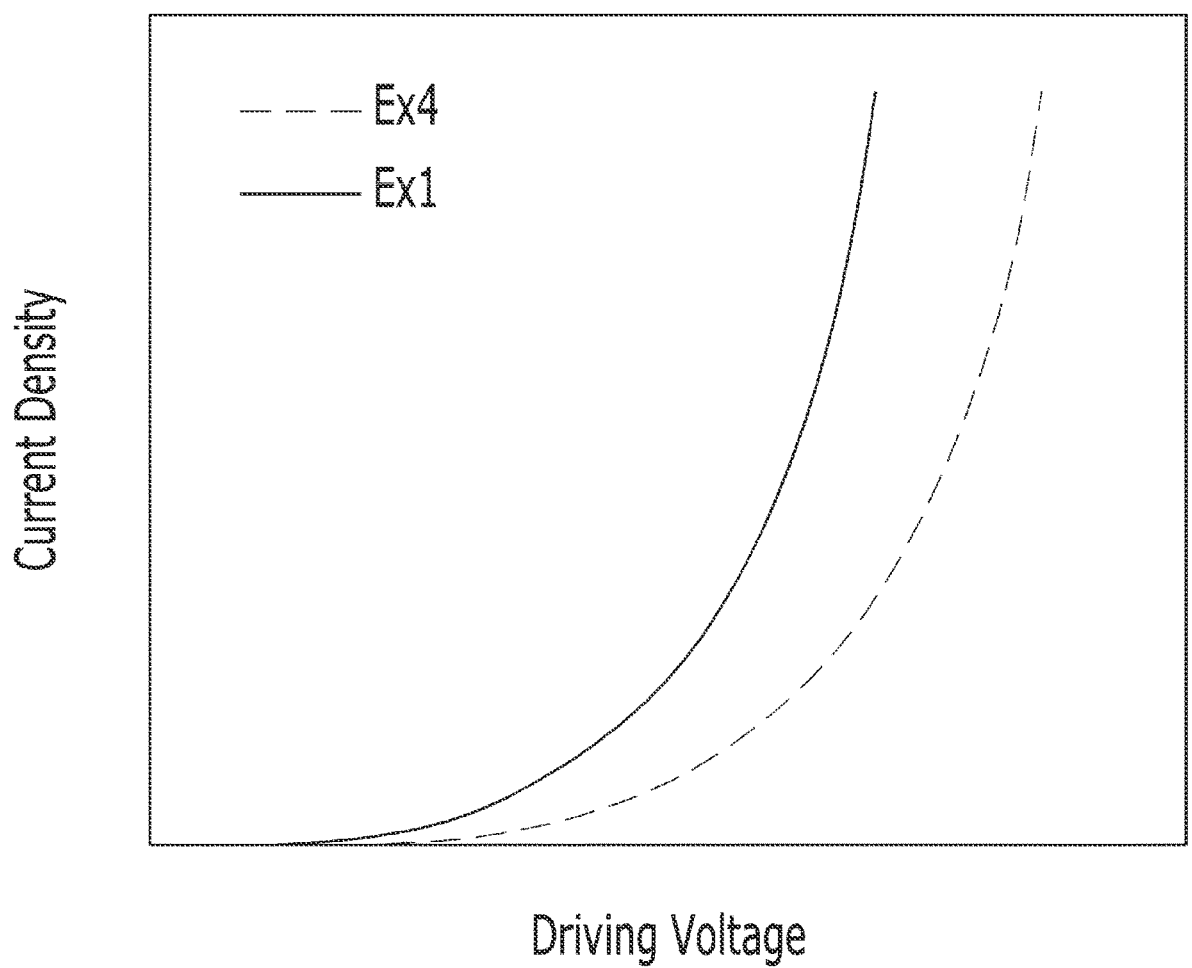
FIG. 11 is a graph comparing driving voltages between the first and second experimental examples.

FIG. 10 is a graph showing CIEx coordinates as a function of current density of first to fourth experimental Examples, and FIG. 11 is a graph comparing driving voltages between the first and second experimental examples.

Regarding the CIEx coordinates as a function of current density of the first to third experimental examples in FIG. 10, there is a great difference between the CIEx color coordinates at a low current density in the first and third experimental examples Ex1 and Ex3 and the CIEx color coordinates at a current density of 1 mA/cm$^2$ or more. On the other hand, in the second experimental example (Ex2), the CIEx color coordinates are reduced to 0.05 or less at a low current density and at a current density of 1 mA/cm$^2$ or more, which, like the second experimental example (Ex2), supports the notion that the color gamut of red at low grayscale values is broadened, as shown in FIGS. 5A and 5B.

Meanwhile, as shown in FIG. 10, in the fourth experimental example Ex4, the CIEx color coordinates are almost uniform at low and high current densities. This is due to the overall low metal dopant content in the first and second layers in the fourth experimental example (Ex4). In this case, the color coordinates can be improved, but the charge mobility in the vertical direction is very low, which can cause a higher driving voltage compared to the first experimental example (Ex1), as shown in FIG. 11.

As shown in FIG. 11, the driving voltage behavior of the first experimental example (Ex1) is similar to that of the second experimental example (Ex2). In the light-emitting device of the present invention as shown in FIG. 1, the driving voltage and color coordinates are improved, so the effects of improving color purity and preventing lateral leakage current at low grayscale values can be realized.

Hereinafter, an embodiment different from the light-emitting device of FIG. 1 will be described.

Figure 12A:
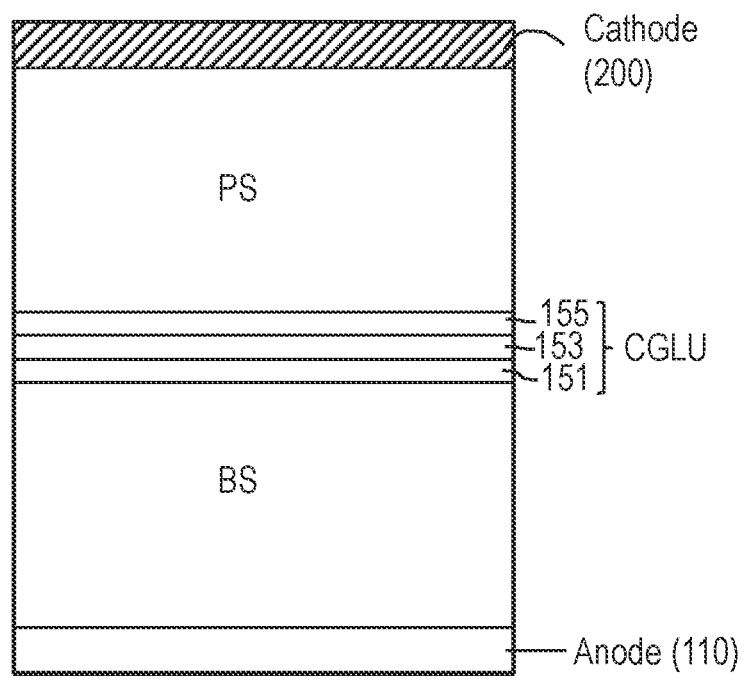
FIGS. 12A and 12B are cross-sectional views showing other embodiments of the present invention.
Figure 12B:
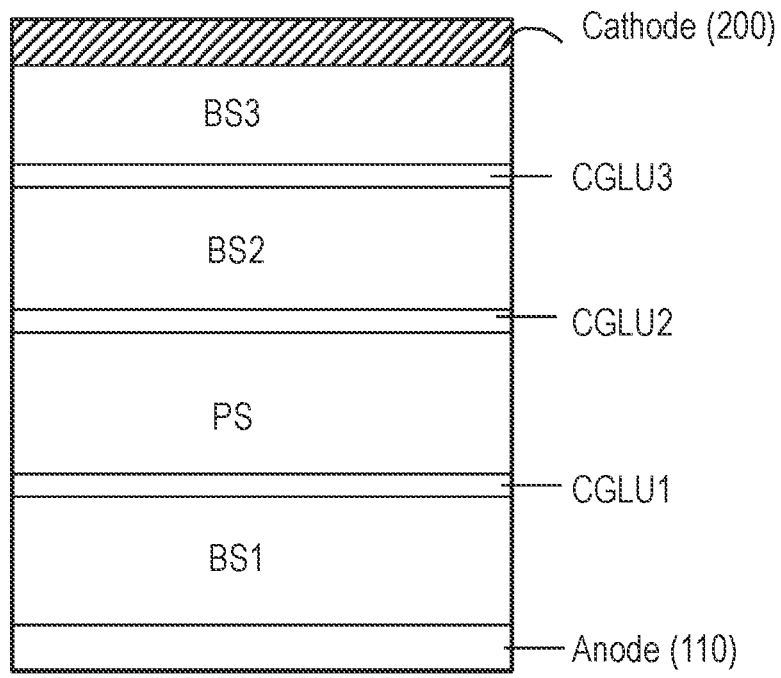

FIGS. 12A and 12B are cross-sectional views showing other embodiments of the present invention.

As shown in FIG. 12A, the light-emitting device according to another embodiment of the present invention includes two stacks between a first electrode 110 and a second electrode 200 facing each other, wherein the two stacks are a blue light-emitting stack BS and a heterogeneous light-emitting stack PS, and further includes a charge generation unit CGLU in which the first to third layers 151, 153, and 155 described with reference to FIG. 1 are stacked between the blue light-emitting stack BS and the heterogeneous light-emitting stack PS.

As shown in FIG. 12B, the light-emitting device according to another embodiment of the present invention includes four stacks between a first electrode 110 and a second electrode 200 facing each other, wherein the four stacks are a first blue-light-emitting stack BS1, a heterogeneous light-emitting stack PS, a second blue-light-emitting stack BS2, and a third blue-light-emitting stack BS3, and further includes charge generation units CGLU1, CGLU2, and CGLU3 including the first to third layers 151, 153, and 155 described with reference to FIG. 1, which are stacked between the respective light-emitting stacks.

The light-emitting device according to one or more embodiments of the present invention is not limited to those described with reference to FIGS. 1, 12A, and 12B, and even in a structure having four or more stacks, each stack has different light-emitting layers independent of one another. One light-emitting layer can be provided in different stacks, or two or more stacks can be provided in contact with different light-emitting layers. In some cases, the blue-light-emitting layer can also be provided so as to be in contact with the light-emitting layer of another color.

The light-emitting device according to one or more embodiments of the present invention is present in a charge generation unit, and the configuration of the light-emitting stack can be freely changed as long as the spirit of the present invention is applied.

Hereinafter, a light-emitting display device to which the light-emitting device according to one or more embodiments of the present invention is applied will be described.

Figure 13:
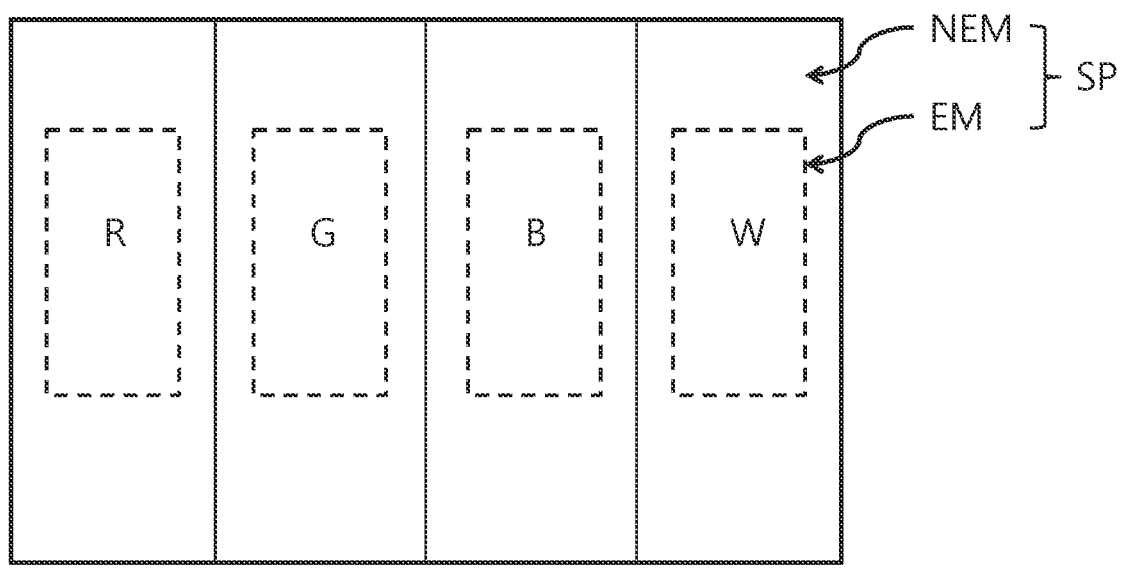
FIG. 13 is a plan view illustrating a light-emitting display device according to the present invention.
Figure 14:
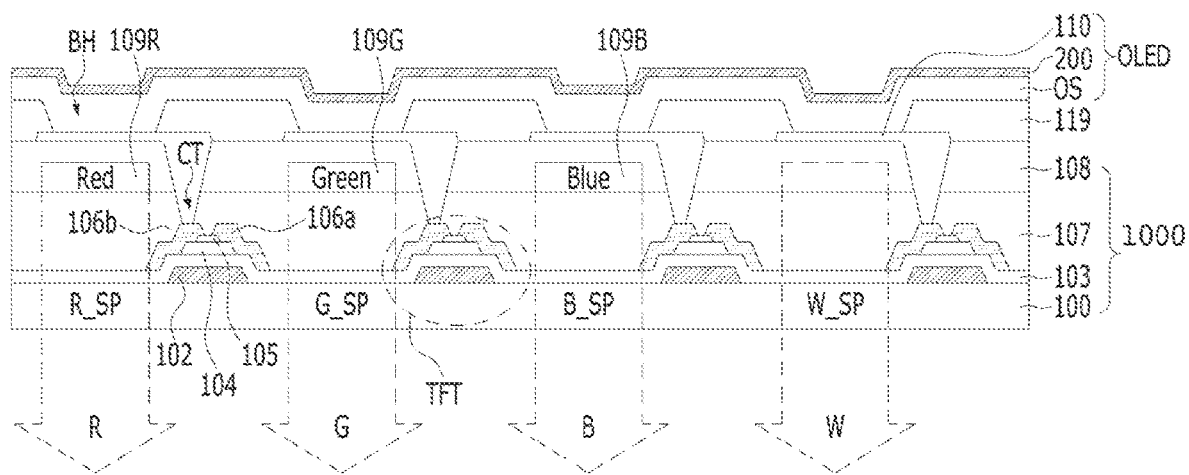
FIG. 14 is a cross-sectional view of each subpixel of FIG. 13 cut in a horizontal direction.

FIG. 13 is a plan view illustrating a light-emitting display device according to one or more embodiments of the present invention, and FIG. 14 is a cross-sectional view of each subpixel of FIG. 13 cut in a horizontal direction.

As shown in FIG. 13, the above-described light-emitting device can be commonly applied to the plurality of subpixels SP of red, green, blue, and white color to emit white light toward the emitting electrode. Each subpixel SP includes a non-emitting region NEM and an emitting region EM.

As shown in FIG. 14, the light-emitting display device according to one or more embodiments of the present invention includes a substrate 100 having a plurality of subpixels R_SP, G_SP, B_SP, and W_SP, a light-emitting device (also referred to as "OLED, organic light-emitting diode") commonly provided on the substrate 100, a thin film transistor (TFT) provided in each of the subpixels and connected to the first electrode 110 of the light-emitting device (OLED), and a color filter layer 109R, 109G, or 109B provided below the first electrode 110 of at least one of the subpixels.

The illustrated example relates to a configuration including the white subpixel W_SP, but the embodiments of the present invention are not limited thereto. A configuration in which the white subpixel W_SP is omitted and only the red, green, and blue subpixels R_SP, G_SP, and B_SP are provided is also possible. In some cases, a combination of a cyan subpixel, a magenta subpixel, and a yellow subpixel capable of creating white by replacing the red, green, and blue subpixels is possible.

The thin film transistor TFT includes, for example, a gate electrode 102, a semiconductor layer 104, and a source electrode 106a and a drain electrode 106b connected to respective sides of the semiconductor layer 104. In addition, a channel protection layer 105 can be further provided on the portion where the channel of the semiconductor layer 104 is located in order to prevent direct connection between the source/drain electrodes 106a and 106b and the semiconductor layer 104.

A gate insulating layer 103 is provided between the gate electrode 102 and the semiconductor layer 104.

The semiconductor layer 104 can be formed of, for example, an oxide semiconductor, amorphous silicon, polycrystalline silicon, or a combination thereof. For example, when the semiconductor layer 104 is an oxide semiconductor, the heating temperature required for forming the thin film transistor can be lowered, and thus the substrate 100 can be selected from among a greater variety of available types thereof, so the semiconductor layer 104 can be advantageously applied to a flexible display device.

In addition, the drain electrode 106b of the thin film transistor TFT can be connected to the first electrode 110 in a contact hole CT provided in the first and second passivation layers 107 and 108.

The first passivation layer 107 is provided to primarily protect the thin film transistor TFT, and color filters 109R, 109G, and 109B can be provided thereon.

When the plurality of subpixels includes a red subpixel, a green subpixel, a blue subpixel, and a white subpixel, the color filter can include first to third color filters in each of the remaining subpixels 109R, 109G, and 109B, excluding the white subpixel W_SP, and can allow the emitted white light to pass through the first electrode 110 for each wavelength. A second passivation layer 108 is formed under the first electrode 110 to cover the first to third color filters 109R, 109G, and 109B. The first electrode 110 is formed on the surface of the second passivation layer 108 excluding the contact hole CT. A circuit stack 1000 includes the substrate 100, the gate insulating layer 103, the first passivation layer 107 and the second passivation layer 108, as well as transistor elements including the gate electrode 102, the semiconductor layer 104 and the channel protection layer 105, among others, of each thin film transistor TFT.

Here, the light-emitting device (OLED) includes a transparent first electrode 110, a second electrode 200 of a reflective electrode facing the first electrode 110, and a charge generation unit 150 between the stacks disposed between the first and second electrodes 110 and 200. As shown in FIG. 1, a first layer 151 in contact with a first electron transport layer of an adjacent first stack is formed of a metal dopant (md), a first host h1 that can be combined with the metal dopant, and a second host h2 capable of transporting electrons, thereby enabling generation and transport of electrons. The second layer 153 is formed of, in addition to the first host h1 and the metal dopant, a p-type organic dopant and a third host that can be combined with the p-type organic dopant to thereby enable the generation of electrons and holes. The material group of the first host and the metal dopant gradually increases toward the interface between the first and second layers, but the second host or the third host is also necessarily included at the interface therebetween. By minimizing the use of the metal dopant, physical resistance in the horizontal direction can be increased and lateral leakage current can be prevented. In addition, by including an electron transport host identical to or similar to the organic material included in the adjacent electron transport layer in the first layer, electrons generated in the first and second layers can be easily supplied to the electron transport layer of the adjacent stack in the vertical direction.

The first electrode 110 is divided into respective subpixels, and the remaining layers of the white-light-emitting device OLED are integrally provided in the entire display area, without being divided into respective subpixels.

Here, the element represented by undescribed reference numeral 119 is a bank, and BH between banks is a bank hole. Light is emitted to an open area through the bank hole, and the bank hole defines a light-emitting part of each subpixel.

Meanwhile, the configuration beneath the first electrode 110, including a substrate 100, a thin film transistor TFT, color filters 109R, 109G, and 109B, and insulating films on which these components are disposed, is referred to as a "thin film transistor array substrate".

The light-emitting device and the light-emitting display device according to one or more embodiments of the present invention have the following effects.

First, a first layer in contact with an adjacent electron transport layer in a charge generation unit that separates a plurality of stacks forming a tandem structure is formed as an electron transport and generation layer, and a second layer is formed as an electron and hole generation layer, thereby minimizing the use of a metal dopant, increasing physical resistance in the horizontal direction, and preventing lateral leakage current.

Second, the first layer is formed using an electron transport host that is identical or similar to the organic material included in the adjacent electron transport layer, thereby easily supplying electrons generated in the first layer and the second layer to the electron transport layer of the adjacent stack in the vertical direction.

Third, the organic material for generating holes in the third layer and the second layer of the charge generation unit is shared, so the holes generated in the charge generation unit are transferred to the hole transport layer of the adjacent stack without an energy barrier.

A light-emitting device disclosure according to an embodiment of present disclosure can comprise a first electrode and a second electrode facing each other, a first stack and a second stack between the first electrode and the second electrode and a charge generation unit between the first stack and the second stack. The charge generation unit can comprise a first layer comprising a first host, a second host, and a metal dopant, a second layer comprising the first host, the metal dopant, a third host different from the first and second hosts, and a p-type organic dopant and a third layer comprising the third host and the p-type organic dopant. The metal dopant in the first and second layers can be present in a maximum amount at the interface between the first and second layers. Also, the metal dopant can be present along with the first host in the first and second layers at an arbitrary vertical distance (or any vertical distance) from the top surface of the first stack.

The first host can be a compound capable of combining with the metal dopant. The second host can be an electron-transporting compound. And the third host can be a compound capable of combining with the p-type organic dopant.

In the first layer, from an interface between the first stack and the first layer to an interface between the first layer and the second layer, a first proportion of a first material group including the first host and the metal dopant can gradually increase, and a second proportion of the second host can gradually decrease.

The second proportion at the interface between the first stack and the first layer can be 100%, and the second proportion at the interface between the first layer and the second layer can be 5% or more and 50% or less.

A content ratio of the metal dopant to the first host in the first material group can be constant in the first layer.

In the second layer, from an interface between the first layer and the second layer to an interface between the second layer and the third layer, a proportion of the first material group can gradually decrease, and a proportion of a second material group including the third host and the p-type organic dopant can gradually decrease.

In the second layer, a content ratio of the metal dopant to the first host in the first material group can be constant, and a content ratio of the p-type organic dopant to the third host in the second material group can be constant.

The first host can be a compound containing phenanthroline, and the second host can be a compound having an anthracene core that does not contain phenanthroline.

A light-emitting device according to another embodiment of the present disclosure can further comprise at least one additional stack between the second stack and the second electrode and an additional charge generation unit identical to the charge generation unit between the second stack and the additional stack.

A light-emitting display according to present disclosure can comprise a substrate comprising a plurality of subpixels, a thin film transistor provided in each of the subpixels on the substrate, and the light-emitting device described above, connected to the thin film transistor.

It will be apparent to those skilled in the art that various modifications and variations can be made in the embodiments of the present invention without departing from the spirit or scope of the invention. Thus, it is intended that the embodiments of the present invention covers such modifications and variations thereto, provided they fall within the scope of the appended claims and their equivalents.

What is claimed is:

1. A light-emitting device, comprising:
a first electrode and a second electrode facing each other;
a first light emitting stack and a second light emitting stack between the first electrode and the second electrode; and
a charge generation stack between the first light emitting stack and the second light emitting stack,
wherein the charge generation stack includes a first layer including a first host, a second host, and a metal dopant, and a second layer including the first host, the metal dopant, a third host, and a p-type organic dopant, and
wherein amounts of the metal dopant in the first layer and the second layer respectively increase in going towards an interface between the first layer and the second layer.

2. The light-emitting device of claim 1, wherein the amount of the metal dopant in the first layer is maximum for the first layer at the interface, and the amount of the metal dopant in the second layer is maximum for the second layer at the interface.

3. The light-emitting device according to claim 2, wherein the first host is a compound containing phenanthroline, and the second host is a compound having an anthracene core that does not contain phenanthroline.

4. The light-emitting device of claim 1, wherein the first light emitting stack includes a first electron transport layer forming an interface with the first layer,
wherein the amount of the metal dopant in the first layer is minimum for the first layer at the interface between the electron transport layer and the first layer,
wherein the charge generation stack includes a third layer forming an interface with the second layer, and
wherein the amount of the metal dopant in the second layer is minimum for the second layer at the interface between the third layer and the second layer.

5. The light-emitting device according to claim 4, wherein a ratio of the second host at the interface between the first stack and the first layer is 100%, and the ratio of the second host at the interface between the first layer and the second layer is 5% or more and 50% or less.

6. The light-emitting device of claim 4, wherein the third layer does not include the metal dopant.

7. The light-emitting device of claim 4, wherein the first layer is on an electron transport layer of the first light emitting stack, and the third layer is adjacent a hole transport layer of the second light emitting stack.

8. The light-emitting device of claim 1, wherein the first host and the metal dopant constitute a host-metal combination, and
wherein a ratio of the second host to the host-metal combination decreases in the first layer in going towards the interface between the first layer and the second layer.

9. The light-emitting device of claim 8, wherein a ratio of the host-metal combination increases in the first layer in going towards the interface between the first layer and the second layer.

10. The light-emitting device of claim 9, wherein the ratio of the host-metal combination increases in the second layer in going towards the interface between the first layer and the second layer.

11. The light-emitting device of claim 8, wherein the third host and the p-type organic dopant constitute a host-organic dopant combination, and
wherein a ratio of the host-organic dopant combination decreases in the second layer in going towards the interface between the first layer and the second layer.

12. The light-emitting device according to claim 11, wherein, in the second layer, a content ratio of the metal dopant to the first host in the host-metal combination is constant, and a content ratio of the p-type organic dopant to the third host in the host-organic dopant combination is constant.

13. The light-emitting device according to claim 8, wherein a content ratio of the metal dopant to the first host in the host-metal combination is constant in the first layer.

14. The light-emitting device of claim 1, wherein the charge generation stack further includes a third layer on the second layer, and includes the third host and the p-type organic dopant.

15. The light-emitting device of claim 14, wherein the first light emitting stack emits blue light, and
wherein the second light emitting stack emits red light and one of yellow-green light or green light.

16. The light-emitting device according to claim 1, wherein the first host is a compound capable of combining with the metal dopant,
wherein the second host is an electron-transporting compound, and
wherein the third host is a compound capable of combining with the p-type organic dopant.

17. The light-emitting device of claim 1, further comprising:
a third light emitting stack between the second light emitting stack and the second electrode; and
another charge generation stack between the second light emitting stack and the third light emitting stack,
wherein the another charge generation stack has same layers as those of the charge generation stack.

18. The light-emitting device of claim 1, wherein the dopant layer and the first host are present in a combination in the first layer and the second layer in any thickness location of the first and second layers.

19. A light-emitting display device comprising:
a substrate comprising a plurality of subpixels;
a thin film transistor provided in each of the plurality of subpixels on the substrate; and
the light-emitting device of claim 1.

20. A light-emitting device comprising:
a first electrode and a second electrode facing each other;
a first stack and a second stack between the first electrode and the second electrode; and
a charge generation unit between the first stack and the second stack,
wherein the charge generation unit comprises:
a first layer comprising a first host, a second host, and a metal dopant;
a second layer comprising the first host, the metal dopant, a third host different from the first and second hosts, and a p-type organic dopant; and
a third layer comprising the third host and the p-type organic dopant, wherein the metal dopant in the first and second layers is present in a maximum amount at the interface between the first and second layers, and wherein the metal dopant is present along with the first host in the first and second layers at any vertical distance from a top surface of the first stack.

\* \* \* \* \*